US010539663B2

(12) United States Patent
Liu et al.

(10) Patent No.: US 10,539,663 B2
(45) Date of Patent: Jan. 21, 2020

(54) LIGHT DETECTING AND RANGING (LIDAR) SIGNAL PROCESSING CIRCUITRY

(71) Applicant: SZ DJI TECHNOLOGY CO., LTD., Shenzhen (CN)

(72) Inventors: Xiang Liu, Shenzhen (CN); Zhipeng Zhan, Shenzhen (CN); Wenjin Pu, Shenzhen (CN); Xiaoping Hong, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/785,243

(22) Filed: Oct. 16, 2017

(65) Prior Publication Data

US 2018/0284229 A1    Oct. 4, 2018

Related U.S. Application Data

(63) Continuation of application No. PCT/CN2017/078668, filed on Mar. 29, 2017.

(51) Int. Cl.
*G01S 7/48* (2006.01)
*G01S 7/487* (2006.01)
*G01S 7/486* (2006.01)

(52) U.S. Cl.
CPC ............ *G01S 7/487* (2013.01); *G01S 7/4865* (2013.01); *G01S 7/4868* (2013.01); *G01S 17/933* (2013.01)

(58) Field of Classification Search
CPC . G01S 17/00; G01S 17/10; G01S 7/48; G01S 7/483
See application file for complete search history.

(56) References Cited

U.S. PATENT DOCUMENTS 3,898,583 A * 8/1975 Shuey ..................... H01S 3/134
250/205
4,283,116 A 8/1981 Weis
(Continued)

FOREIGN PATENT DOCUMENTS

CN    1518210 A    8/2004
CN    2834098 Y    11/2006
(Continued)

OTHER PUBLICATIONS

Aijazi, et al., "Segmentation Based Classification of 3D Urban Point Clouds: A Super-Voxel Based Approach with Evaluation," (2013), 27 pages.
(Continued)

*Primary Examiner* — Luke D Ratcliffe
(74) *Attorney, Agent, or Firm* — Finnegan, Henderson, Farabow, Garrett & Dunner, LLP

(57) ABSTRACT

Introduced here are techniques for implementing a comparator-based LIDAR system with improved components, such as an improved high-speed comparator circuit, to acquire depth information from the surroundings of an unmanned moving object (e.g., a UAV). In various embodiments, the LIDAR system includes an amplifier module with different configurations of anti-saturation circuitry. The LIDAR system may further include various feedback control mechanisms for noise interference reduction and timing measurement compensation including, for example, dynamic gain adjustment of the photodetector module, and/or dynamic adjustment of comparators' thresholds. Among other components, the disclosed comparator circuit can provide the LIDAR system with a wide dynamic range, preventing large signal amplification saturation while also providing sufficient magnification of small signals.

24 Claims, 14 Drawing Sheets

(56) References Cited

U.S. PATENT DOCUMENTS

| | | |
|---|---|---|
| 4,939,480 A | 7/1990 | Frye et al. |
| 5,179,565 A | 1/1993 | Tsuchiya et al. |
| 5,249,046 A | 9/1993 | Ulich et al. |
| 6,101,455 A | 8/2000 | Davis |
| 6,246,258 B1 | 6/2001 | Lesea |
| 6,344,937 B1 | 2/2002 | Sparrold et al. |
| 6,666,855 B2 | 12/2003 | Somani et al. |
| 7,085,400 B1 | 8/2006 | Holsing et al. |
| 7,193,478 B2 | 3/2007 | Filip |
| 7,236,299 B1 | 6/2007 | Smith et al. |
| 7,336,407 B1 | 2/2008 | Adams et al. |
| 7,564,571 B2 | 7/2009 | Karabassi et al. |
| 7,843,448 B2 | 11/2010 | Wheeler et al. |
| 7,899,598 B2 | 3/2011 | Woon et al. |
| 8,224,097 B2 | 7/2012 | Matei et al. |
| 8,396,293 B1 | 3/2013 | Korah et al. |
| 8,488,877 B1 | 7/2013 | Owechko et al. |
| 8,503,046 B2 | 8/2013 | Mikkelsen et al. |
| 8,605,998 B2 | 12/2013 | Samples et al. |
| 8,620,089 B1 | 12/2013 | Korah et al. |
| 8,665,122 B2 | 3/2014 | Klepsvik |
| 8,773,182 B1 | 7/2014 | Degani et al. |
| 8,798,372 B1 | 8/2014 | Korchev et al. |
| 9,076,219 B2 | 7/2015 | Cha et al. |
| 9,097,804 B1 | 8/2015 | Silver et al. |
| 9,098,753 B1 | 8/2015 | Zhu et al. |
| 9,128,190 B1 | 9/2015 | Ulrich et al. |
| 9,369,697 B2 | 6/2016 | Kumagai et al. |
| 9,383,753 B1 | 7/2016 | Templeton et al. |
| 9,396,545 B2 | 7/2016 | Fu et al. |
| 9,470,548 B2 | 10/2016 | Ahn et al. |
| 9,584,748 B2 | 2/2017 | Saito |
| 9,644,857 B1 | 5/2017 | Ashgriz et al. |
| 9,659,378 B2 | 5/2017 | Sasaki et al. |
| 2002/0136251 A1 | 9/2002 | Green et al. |
| 2004/0135992 A1* | 7/2004 | Munro ............... G01S 7/483 356/4.01 |
| 2005/0248749 A1 | 11/2005 | Kiehn et al. |
| 2005/0254628 A1 | 11/2005 | Saladin et al. |
| 2007/0214687 A1 | 9/2007 | Woon et al. |
| 2007/0296951 A1 | 12/2007 | Kuijk et al. |
| 2008/0114253 A1 | 5/2008 | Randall et al. |
| 2008/0319706 A1 | 12/2008 | Uffenkamp et al. |
| 2009/0310867 A1 | 12/2009 | Matei et al. |
| 2010/0271615 A1 | 10/2010 | Sebastian et al. |
| 2011/0285981 A1 | 11/2011 | Justice et al. |
| 2012/0032541 A1 | 2/2012 | Chen et al. |
| 2012/0121166 A1 | 5/2012 | Ko et al. |
| 2012/0170024 A1 | 7/2012 | Azzazy et al. |
| 2012/0170029 A1 | 7/2012 | Azzazy et al. |
| 2012/0248288 A1 | 10/2012 | Linder et al. |
| 2012/0256916 A1 | 10/2012 | Kitamura et al. |
| 2013/0107243 A1* | 5/2013 | Ludwig ............... G01C 3/08 356/5.01 |
| 2013/0284475 A1 | 10/2013 | Hirabayashi et al. |
| 2013/0329065 A1 | 12/2013 | Haraguchi et al. |
| 2014/0049765 A1 | 2/2014 | Zheleznyak et al. |
| 2014/0071121 A1 | 3/2014 | Russ et al. |
| 2014/0132723 A1 | 5/2014 | More |
| 2014/0368651 A1 | 12/2014 | Irschara et al. |
| 2015/0185313 A1 | 7/2015 | Zhu |
| 2015/0206023 A1 | 7/2015 | Kochi et al. |
| 2015/0219920 A1 | 8/2015 | Ando et al. |
| 2015/0229102 A1 | 8/2015 | Khan et al. |
| 2016/0070981 A1 | 3/2016 | Sasaki et al. |
| 2016/0154999 A1 | 6/2016 | Fan et al. |
| 2016/0311528 A1 | 10/2016 | Nemovi et al. |
| 2016/0327779 A1 | 11/2016 | Hillman |
| 2017/0046840 A1 | 2/2017 | Chen et al. |
| 2017/0046845 A1 | 2/2017 | Boyle et al. |
| 2017/0153319 A1 | 6/2017 | Villeneuve et al. |
| 2017/0178352 A1 | 6/2017 | Harmsen et al. |
| 2017/0227628 A1 | 8/2017 | Zheleznyak et al. |
| 2017/0248698 A1 | 8/2017 | Sebastian et al. |
| 2017/0316701 A1 | 11/2017 | Gil et al. |

FOREIGN PATENT DOCUMENTS

| | | |
|---|---|---|
| CN | 1886874 A | 12/2006 |
| CN | 101029934 A | 9/2007 |
| CN | 101102160 A | 1/2008 |
| CN | 101216562 A | 7/2008 |
| CN | 101256232 A | 9/2008 |
| CN | 201207034 Y | 3/2009 |
| CN | 202019342 U | 10/2011 |
| CN | 202182717 U | 4/2012 |
| CN | 102508255 A | 6/2012 |
| CN | 102621555 A | 8/2012 |
| CN | 202443121 U | 9/2012 |
| CN | 102944224 A | 2/2013 |
| CN | 102946049 A | 2/2013 |
| CN | 102971657 A | 3/2013 |
| CN | 103227413 A | 7/2013 |
| CN | 103257342 A | 8/2013 |
| CN | 103257348 A | 8/2013 |
| CN | 103403577 A | 11/2013 |
| CN | 103499819 A | 1/2014 |
| CN | 103545802 A | 1/2014 |
| CN | 103791785 A | 5/2014 |
| CN | 203645633 | 6/2014 |
| CN | 203688801 U | 7/2014 |
| CN | 103969637 A | 8/2014 |
| CN | 103983963 A | 8/2014 |
| CN | 104142504 A | 11/2014 |
| CN | 104463872 A | 3/2015 |
| CN | 104600902 A | 5/2015 |
| CN | 104714220 A | 6/2015 |
| CN | 104833979 A | 8/2015 |
| CN | 105517903 A | 4/2016 |
| CN | 105628026 A | 6/2016 |
| CN | 105759253 A | 7/2016 |
| CN | 105759279 A | 7/2016 |
| CN | 106019296 A | 10/2016 |
| CN | 106019300 A | 10/2016 |
| CN | 106019923 A | 10/2016 |
| CN | 106030431 A | 10/2016 |
| CN | 106063089 A | 10/2016 |
| CN | 106093958 A | 11/2016 |
| CN | 106093963 A | 11/2016 |
| CN | 106199622 A | 12/2016 |
| CN | 106486887 A | 3/2017 |
| CN | 205989670 U | 3/2017 |
| CN | 106597414 A | 4/2017 |
| CN | 106597416 A | 4/2017 |
| CN | 107037721 A | 8/2017 |
| JP | 63194211 A | 8/1988 |
| JP | 2002199682 A | 7/2002 |
| JP | 2005321547 A | 11/2005 |
| JP | 2015200555 A | 11/2015 |
| JP | 6076541 B2 | 2/2017 |
| KR | 101665938 B1 | 10/2016 |
| WO | 2010051805 A2 | 5/2010 |
| WO | 2015148824 A1 | 10/2015 |
| WO | 2016121531 A1 | 8/2016 |
| WO | 2016127357 A1 | 8/2016 |
| WO | 2016170333 A1 | 10/2016 |
| WO | 2017021778 A2 | 2/2017 |

OTHER PUBLICATIONS

Douillard, et al., "On the Segmentation of 3D LIDAR Point Clouds," (2011), 8 pages.

Hackel, et al., "Fast Semantic Segmentation of 3D Point Clouds with Strongly Varying Density," (2016), 8 pages.

Levinson, et al., "Automatic Online Calibration of Cameras and Lasers," (2013), 8 pages.

Liu, et al., "A 3.9 ps RMS Resolution Time-To-Digital Converter Using Dual-sampling Method on Kintex UltraScale FPGA," (2006), 2 pages.

Montemerlo, et al., "Junior: The Stanford Entry in the Urban Challenge," (2008), 31 pages.

Palka, et al., "A Novel Method Based Solely on FPGA Units Enabling Measurement of Time and Charge of Analog Signals in Positron Emission Tomography," (2014), 6 pages.

(56) References Cited

OTHER PUBLICATIONS

Raismian, "Google Cars Autonomous Driving," (2017), 1 pages.
Schwarze, "A New Look at Risley Prisms," (2006), 5 pages.
Tongtong, et al., "Gaussian-Process-Based Real-Time Ground Segmentation for Autonomous Land Vehicles," (2014), 25 pages.
Wu, et al., "Several Key Issues on Implementing Delay Line Based TDCs using FPGA," (2009), 6 pages.
International Searching Authority, International Search Report and the Written Opinion of the International Searching Authority, PCT Application PCT/CN2017/078611, dated Dec. 29, 2017, 12 pages.
International Searching Authority, "International Search Report and Written Opinion of the International Searching Authority," PCT Application PCT/CN2017/078668, dated Dec. 28, 2017, 13 pages.
Junhua, et al., "Research on CFAR Control Technology of Lidar Based on FPGA," Journal of Infrared and Millimeter Wave, vol. 28, No. 1., Feb. 28, 2009., ISSN:1001-9014., (p. 51, left col. 1, right col. 3-5, Figure 1).

\* cited by examiner

LIGHT DETECTING AND RANGING (LIDAR) SIGNAL PROCESSING CIRCUITRY

CROSS REFERENCE TO RELATED APPLICATION

The present application is a continuation of International Patent Application No. PCT/CN2017/078668, filed Mar. 29, 2017, which is incorporated herein by reference.

TECHNICAL FIELD

The present disclosure is directed generally to electronic signal processing, and more specifically, to signal processing associated components, systems and techniques in light detection and ranging (LIDAR) applications.

BACKGROUND

With their ever increasing performance and lowering cost, unmanned movable objects, such as unmanned aerial vehicles (UAVs), are now extensively used in many fields. Representative missions include crop surveillance, real estate photography, inspection of buildings and other structures, fire and safety missions, border patrols, and product delivery, among others. For obstacle detection as well as for other functionalities, it is beneficial for UAVs to be equipped with obstacle detection and surrounding environment scanning devices. Light detection and ranging (LIDAR, also known as "light radar") is a reliable and stable detection technology because it is able to function under nearly all weather conditions. However, traditional LIDAR devices are typically expensive because they need high performance analog-to-digital converter chips, making most traditional LIDAR devices unfit for low cost unmanned vehicle applications.

Accordingly, there remains a need for improved techniques and systems for implementing LIDAR scanning modules, for example, such as those carried by aerial vehicles, aerial platforms, autonomous vehicles, boats, or robots.

SUMMARY

The following summary is provided for the convenience of the reader and identifies several representative embodiments of the disclosed techniques. A light detection and ranging system in accordance with a representative embodiment includes a light sensing module to detect a pulse light signal and generate a corresponding electronic signal, and an amplifier module coupled to the light sensing module to process the corresponding electronic signal. The amplifier module can further be coupled to a pulse information acquisition subsystem to extract pulse energy information. The amplifier module may include an operational amplifier and anti-saturation circuitry coupled to the operational amplifier to selectively reduce a gain of the operational amplifier based on a magnitude of the corresponding electronic signal, or to limit the magnitude of the corresponding electronic signal that the operational amplifier receives to a predetermined range, or both. In some embodiments, the system may further include a controller having an input to receive the pulse energy information and an output coupled to the light sensing module. In some implementations, the controller is configured to dynamically control a gain of the light sensing module in response to the pulse energy information.

Some embodiments provide that the anti-saturation circuitry includes an operational amplifier anti-saturation circuit positioned on a feedback loop of the operational amplifier to reduce the gain of the operational amplifier. Depending on the embodiment, as the magnitude of the corresponding electronic signal increases, the gain of the operational amplifier can be proportionally reduced by the operational amplifier anti-saturation circuit.

In one or more embodiments, the anti-saturation circuitry may include a pre-amplifier anti-saturation circuit positioned between a signal input of the amplifier module and the input of the operational amplifier, to limit the magnitude of the corresponding electronic signal that the operational amplifier receives. In some examples, the anti-saturation circuitry may further include a post-amplifier anti-saturation circuit positioned between a signal output of the amplifier module and the output of the operational amplifier, to limit a magnitude of an amplified electronic signal that the operational amplifier outputs.

The system can further include a comparator module to receive an amplified electronic signal from the operational amplifier module and to generate a digitized electronic signal. Further, the system can include a time-to-digital converter module to receive the digitized electronic signal and generate time information associated with the digitized electronic signal.

According to certain embodiments, the controller can be further coupled to the comparator module to dynamically adjust a triggering threshold of the comparator module based on noise observed by the controller. In some examples, the gain of the light sensing module is reduced when noise exceeds a triggering threshold of the comparator module.

In some variations, the controller is configured to determine whether ambient light is a dominant source of noise observed by the controller. In some implementations, the controller is configured to, when the ambient light is determined to be the dominant source of the noise observed by the controller, prioritize reducing the gain of the light sensing module for reducing possible interference from the noise. In a number of embodiments, the controller is configured to, when the ambient light is determined not to be the dominant source of the noise observed by the controller, prioritize increasing a triggering threshold of the comparator module for reducing possible interference from the noise.

In one or more embodiments, the controller is configured to perform double edge timing measurement of a pulse, and to compensate for timing error based on said double edge timing measurement. Further, in a number of examples, the controller is configured to perform double edge timing measurement of a pulse, and in some examples, may be able to estimate the pulse energy information based on said double edge timing measurement. Several embodiments of the present disclosure also include that the controller is configured to perform double edge timing measurement of a pulse, and to estimate a surface profile of an object detected by the system based on said double edge timing measurement.

Some of the embodiments disclosed herein can further include a pulse information acquisition subsystem to generate the pulse energy information based on output from the amplifier module. In some variations, the pulse information acquisition subsystem includes an integrator circuit for calculating pulse energy information of a given pulse. Additionally or alternatively, the pulse information acquisition subsystem includes a peak holding circuit for retaining peak information of a given pulse. In some examples, the pulse information acquisition subsystem includes a pulse expansion circuit for expanding a waveform of a given pulse.

The system can further include a light emitting module coupled to the controller to emit the pulse light signal in response to control from the controller. A protection circuit may be included in certain examples to protect the light emitting module against a voltage spike. In some implementations, the protection circuit is positioned between a light emitting device and the ground, the protection circuit including a diode connected in parallel with a control switch for controlling the light emitting device. In variations, the protection circuit includes a diode and is connected in parallel with a light emitting device, and wherein a control for controlling the light emitting device is positioned between the light emitting device and the ground.

Some examples of the system can include a subsequent amplifier module coupled to the amplifier module to form a multi-stage amplifier. In some further examples, the system can include second comparator coupled to a same input as a first comparator in the comparator module. The second comparator may receive a different triggering threshold voltage than the first comparator. In some embodiments, each comparator is connected to an individual time-to-digital converter module.

At least one embodiment includes an unmanned aerial vehicle that includes an airframe, a laser radar system as described above, a controller configured to maneuver the vehicle in response to readings from the laser radar system, and a plurality of thrusters carried by the airframe and positioned to maneuver the vehicle in response to inputs from the controller.

Still a further embodiment includes a method of manufacturing any and all combinations of the devices described above.

DETAILED DESCRIPTION

It is important for unmanned movable objects, such as unmanned aerial vehicles (UAVs), to be able to independently detect obstacles and/or to automatically engage in obstacle avoidance maneuvers. Light detection and ranging (LIDAR) is a reliable and stable detection technology because LIDAR can remain functional under nearly all weather conditions. Moreover, unlike traditional image sensors (e.g., cameras) that can only sense the surroundings in two dimensions, LIDAR can obtain three-dimensional information by detecting the depth. To facilitate the discussion hereafter, the basic working principle of an example type of LIDAR can be understood as follows: first, a LIDAR system emits a light signal (e.g., a pulsed laser); then, after the light signal is reflected by a target object, the LIDAR system detects the reflected light signal, and measures the time passed between when the light is emitted and when the reflected light is detected. This time passed is also known as the time of flight (TOF). The distance to a surrounding object can be calculated based on the time difference and the estimated speed of light, for example, "distance=(speed of light×time of flight)/2." With additional information such as the angle of the emitting light, three dimensional information of the surroundings can be obtained by the LIDAR system.

However, traditional LIDAR systems are typically expensive because they need high performance analog-to-digital converter chips, making most traditional LIDAR systems unsuitable for low cost applications. Specifically, in order to successfully capture a very short pulse signal (e.g., with a pulse duration of only tens of nanoseconds to a few nanoseconds), most conventional LIDAR systems rely on high-speed analog-to-digital converters (ADCs) (e.g., with a sampling rate that exceeds one giga sample per second (GSPS)) to perform the digitization of light pulse signals. High-speed ADCs typically are of high cost, high power consumption. Furthermore, high-speed ADC sampling is based on sampling analog signals with different voltages at the same time interval (i.e., sampling with respect to the time axis). As such, the timing of the sampling is independent from the pulse signal and without any time correlation. An extraction algorithm is needed to extract the timing information of the analog signal. These drawbacks make high-speed ADCs based LIDAR a less preferable solution for low cost applications.

Figure 2A:
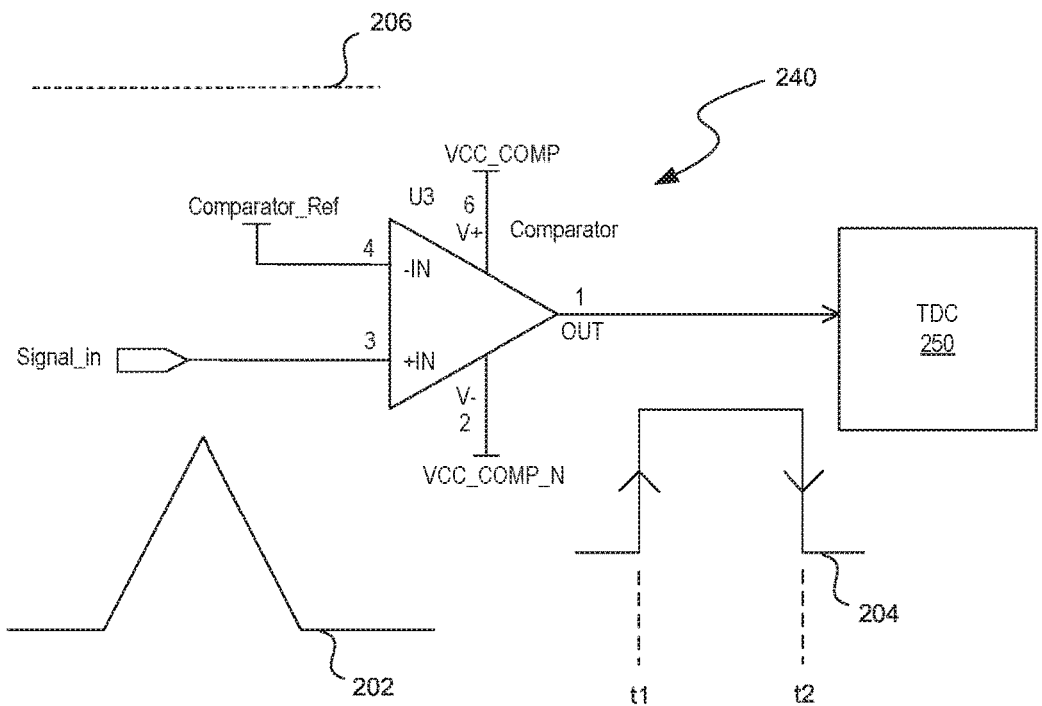
FIG. 2A is a simplified diagram illustrating the basic working principle of a comparator-based sampling method.
Figure 2B:
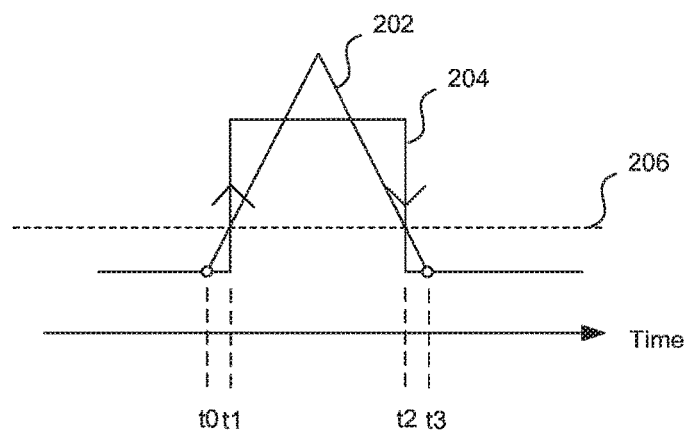
FIG. 2B is an illustration of the input and output waveforms of the pulse signal before and after the comparator.

An alternative solution is to utilize comparator-based sampling in the LIDAR system for gathering the timing information of the reflected pulse signal. FIG. 2A is a simplified diagram illustrating the basic working principle of a comparator-based sampling method. The method is based on the timing of when the analog signal crosses certain voltage thresholds. As shown in the example of FIG. 2A, a comparator 240 is basically an operational amplifier that is configured to compare the voltage between its non-inverting input (PIN3) against its inverting input (PIN4), and to output a logic high or low voltage based on the comparison. For example, when an analog pulse signal 202 (e.g., that is reflected back from a target object) is received at the non-inverting input PIN3, the comparator 240 compares the voltage level of the signal 202 against a reference threshold voltage 206 (also referred to herein as a "triggering threshold") at the inverting input PIN4. When the signal 202 exceeds the reference threshold voltage 206, the output of the comparator 202 becomes high (e.g., VDD), or otherwise low (e.g., GND). The result is a digitized (e.g., binary), square pulse signal 204. FIG. 2B is an illustration of the input and output waveforms of the pulse signal before and after the comparator. When the square pulse signal 204 is output to a time-to-digital converter (TDC) 250, relevant timing information of the signal 204 (e.g., time t1 and time t2) can be extracted. Because there is a correlation between the sampling points and time (in contrast to the ADC based method), the comparator-based sampling method can more effectively capture pulse information in a more direct manner.

However, the method of using the comparator has its limitation in collecting a signal that may fluctuate in wide range rapidly (i.e., a highly dynamic signal). Specifically, certain components (e.g., operational amplifiers) in the LIDAR system would saturate when exposed to a signal that fluctuates too much in its magnitude. This "high dynamic range signal saturation" issue is rather particular in LIDAR based unmanned vehicle applications (e.g., for collision avoidance or 3D surrounding environment scanning), as opposed to other typical LIDAR based applications, such as distance measurement (or "range finding"). In distance measurement applications, because the only task at hand is to determine the static distance between the range finder and the target object, it is acceptable to perform the ranging measurement for the same distance with multiple tests. The initial tests can be performed with circuits operating in a reduced gain setting and lowered sensitivity in order to avoid circuit saturation while obtaining an approximate range and a proper gain setting for the subsequent tests, thereby mitigating or avoiding the aforesaid saturation problem.

In contrast, in an unmanned vehicle application, the LIDAR system needs to scan the surroundings with a relatively high frequency (e.g., multiple times per second). With both the unmanned vehicle moving and with multiple objects in the surroundings, likely in different distances in relation to the unmanned vehicle, a design that needs to perform multiple tests for gain adjustment before an accurate measurement can be made is impractical, if not simply unacceptable. It is observed in the present disclosure that, in measuring an object that is 0.1 meter away versus 50 meters away, the magnitude difference between the reflected light signal can reach $10^4 \sim 10^5$ times. Therefore, it is desirable to have a low cost comparator-based LIDAR system that still has a high dynamic range (i.e., would not saturate when faced with reflected signals having a large step of difference in their strengths).

Accordingly, the present technology is directed to techniques for implementing a LIDAR system with improved components, such as an improved comparator circuit, to acquire depth information of the unmanned vehicle's surroundings. Among other components, the disclosed comparator circuit can provide the LIDAR system with a wide dynamic range, preventing large signal amplification saturation while also providing sufficient magnification of small signals.

In the following description, the example of a UAV is used, for illustrative purposes only, to explain various techniques that can be implemented using a LIDAR scanning module that is cheaper and lighter than the traditional LIDARs. In other embodiments the techniques introduced here are applicable to other suitable scanning modules, vehicles, or both. For example, even though one or more figures introduced in connection with the techniques illustrate a UAV, in other embodiments, the techniques are applicable in a similar manner to other type of movable objects including, but not limited to, an unmanned vehicle, a hand-held device, or a robot. In another example, even though the techniques are particularly applicable to laser beams produced by laser diodes in a LIDAR system, other types of light sources (e.g., other types of lasers, or light emitting diodes (LEDs)) can be applicable in other embodiments.

In the following, numerous specific details are set forth to provide a thorough understanding of the presently disclosed technology. In other embodiments, the techniques introduced here can be practiced without these specific details. In other instances, well-known features, such as specific fabrication techniques, are not described in detail in order to avoid unnecessarily obscuring the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

Several details describing structures or processes that are well-known and often associated with UAVs and corresponding systems and subsystems, but that can unnecessarily obscure some significant aspects of the disclosed techniques, are not set forth in the following description for purposes of clarity. Moreover, although the following disclosure sets forth several embodiments of different aspects of the present disclosure, several other embodiments can have different configurations or different components than those described in this section. Accordingly, the introduced techniques can have other embodiments with additional elements or without several of the elements described below.

Many embodiments of the present disclosure described below can take the form of computer- or controller-executable instructions, including routines executed by a programmable computer or controller. Those skilled in the relevant art will appreciate that the introduced techniques can be practiced on computer or controller systems other than those shown and described below. The techniques introduced herein can be embodied in a special-purpose computer or data processor that is specifically programmed, configured or constructed to perform one or more of the computer-executable instructions described below. Accordingly, the terms "computer" and "controller" as generally used herein refer to any data processor and can include Internet appliances and handheld devices (including palm-top computers, wearable computers, cellular or mobile phones, multi-processor systems, processor-based or programmable consumer electronics, network computers, mini computers and the like). Information handled by these computers and controllers can be presented at any suitable display medium, including a liquid crystal display (LCD). Instructions for performing computer- or controller-executable tasks can be stored in or on any suitable computer-readable medium, including hardware, firmware or a combination of hardware and firmware. Instructions can be contained in any suitable memory device, including, for example, a flash drive, USB device, and/or other suitable medium.

The terms "coupled" and "connected," along with their derivatives, can be used herein to describe structural relationships between components. It should be understood that these terms are not intended as synonyms for each other. Rather, in particular embodiments, "connected" can be used to indicate that two or more elements are in direct contact with each other. Unless otherwise made apparent in the context, the term "coupled" can be used to indicate that two or more elements are in either direct or indirect (with other intervening elements between them) contact with each other, or that the two or more elements co-operate or interact with each other (e.g., as in a cause and effect relationship), or both.

For purposes of discussion herein, the terms "horizontal," "horizontally," "vertical," or "vertically," are used in a relative sense, and more specifically, in relation to the main body of the unmanned vehicle. For example, a "horizontal" scan means a scan having a scan plane that is generally parallel to the plane formed by the main body, while a "vertical" scan means a scan having a scan plane that is generally perpendicular to the plane formed by the main body.

1. Overview

Figure 1:
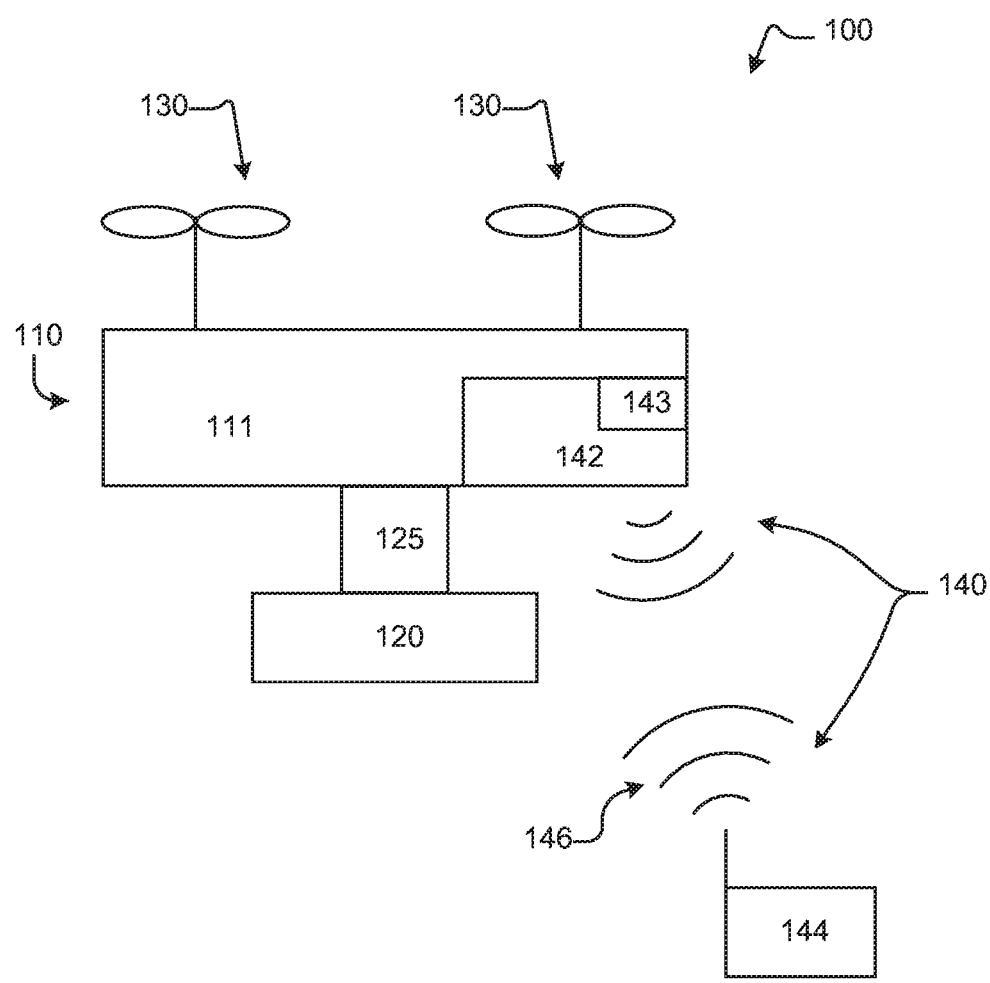
FIG. 1 is a schematic illustration of a representative system having a moveable object with a number of elements configured in accordance with one or more embodiments of the present technology.

FIG. 1 is a schematic illustration of a representative system 100 having elements in accordance with one or more embodiments of the present technology. The system 100 includes a movable object 110 and a control system 140. Although the movable object 110 is depicted as an unmanned aerial vehicle (UAV), this depiction is not intended to be limiting, and any suitable type of movable object can be used in other embodiments, such as an unmanned nautical vessel, an unmanned robot, an unmanned motorized vehicle, an autonomous car, or any other suitable movable object.

The moveable object 110 can include a main body 111 (e.g., an airframe) that can carry a payload 120, for example, an imaging device or an optoelectronic scanning device (e.g., a LIDAR device). In particular embodiments, the payload 120 can be a camera, for example, a video camera and/or still camera. The camera can be sensitive to wavelengths in any of a variety of suitable bands, including visual, ultraviolet, infrared and/or other bands. In still further embodiments, the payload 120 can include other types of sensors and/or other types of cargo (e.g., packages or other deliverables). In many of these embodiments, the payload 120 is supported relative to the main body 111 with a carrying mechanism 125. The carrying mechanism 125, in some embodiments, can allow the payload 120 to be independently positioned relative to the main body 111. For instance, the carrying mechanism 125 can permit the payload 120 to rotate around one, two, three, or more axes. In other embodiments, the carrying mechanism 125 can permit the payload 120 to move linearly along one, two, three, or more axes. The axes for the rotational or translational movement may or may not be orthogonal to each other. In this way, when the payload 120 includes an imaging device, the imaging device can be moved relative to the main body 111 to photograph, video or track a target.

In some embodiments, the payload 120 can be rigidly coupled to or connected with the movable object 110 such that the payload 120 remains generally stationary relative to the movable object 110. For example, the carrying mechanism 125 that connects the movable object 110 and the payload 120 may not permit the payload 120 to move relative to the movable object 110. In other embodiments, the payload 120 can be coupled directly to the movable object 110 without requiring the carrying mechanism 125.

One or more propulsion units 130 can enable the movable object 110 to take off, land, hover, and move in the air with respect to up to three degrees of freedom of translation and up to three degrees of freedom of rotation. In some embodiments, the propulsion units 130 can include one or more rotors. The rotors can include one or more rotor blades coupled to a shaft. The rotor blades and shaft can be rotated by a suitable drive mechanism, such as a motor. Although the propulsion units 130 of the moveable object 110 are depicted as propeller-based and can have four rotors, any suitable number, type, and/or arrangement of propulsion units can be used. For example, the number of rotors can be one, two, three, four, five, or even more. The rotors can be oriented vertically, horizontally, or at any other suitable angle with respect to the moveable object 110. The angle of the rotors can be fixed or variable. The propulsion units 130 can be driven by any suitable motor, such as a DC motor (e.g., brushed or brushless) or an AC motor. In some embodiments, the motor can be configured to mount and drive a rotor blade.

The movable object 110 is configured to receive control commands from the control system 140. In the embodiment shown in FIG. 1, the control system 140 includes some components carried on the moveable object 110 and some components positioned off the moveable object 110. For example, the control system 140 can include a first controller 142 carried by the moveable object 110 and a second controller 144 (e.g., a human-operated, remote controller) positioned remote from the moveable object 110 and connected via a communication link 146 (e.g., a wireless link such as a radio frequency (RF) based link). The first controller 142 can include a computer-readable medium 143 that executes instructions directing the actions of the moveable object 110, including, but not limited to, operation of the propulsion system 130 and the payload 120 (e.g., a camera). The second controller 144 can include one or more input/output devices, e.g., a display and control buttons. The operator manipulates the second controller 144 to control the moveable object 110 remotely, and receives feedback from the moveable object 110 via the display and/or other interfaces on the second controller 144. In other representative embodiments, the moveable object 110 can operate autonomously, in which case the second controller 144 can be eliminated, or can be used solely for operator override functions.

2. A High Dynamic Range Light Detection and Ranging (Lidar) System

Figure 3:
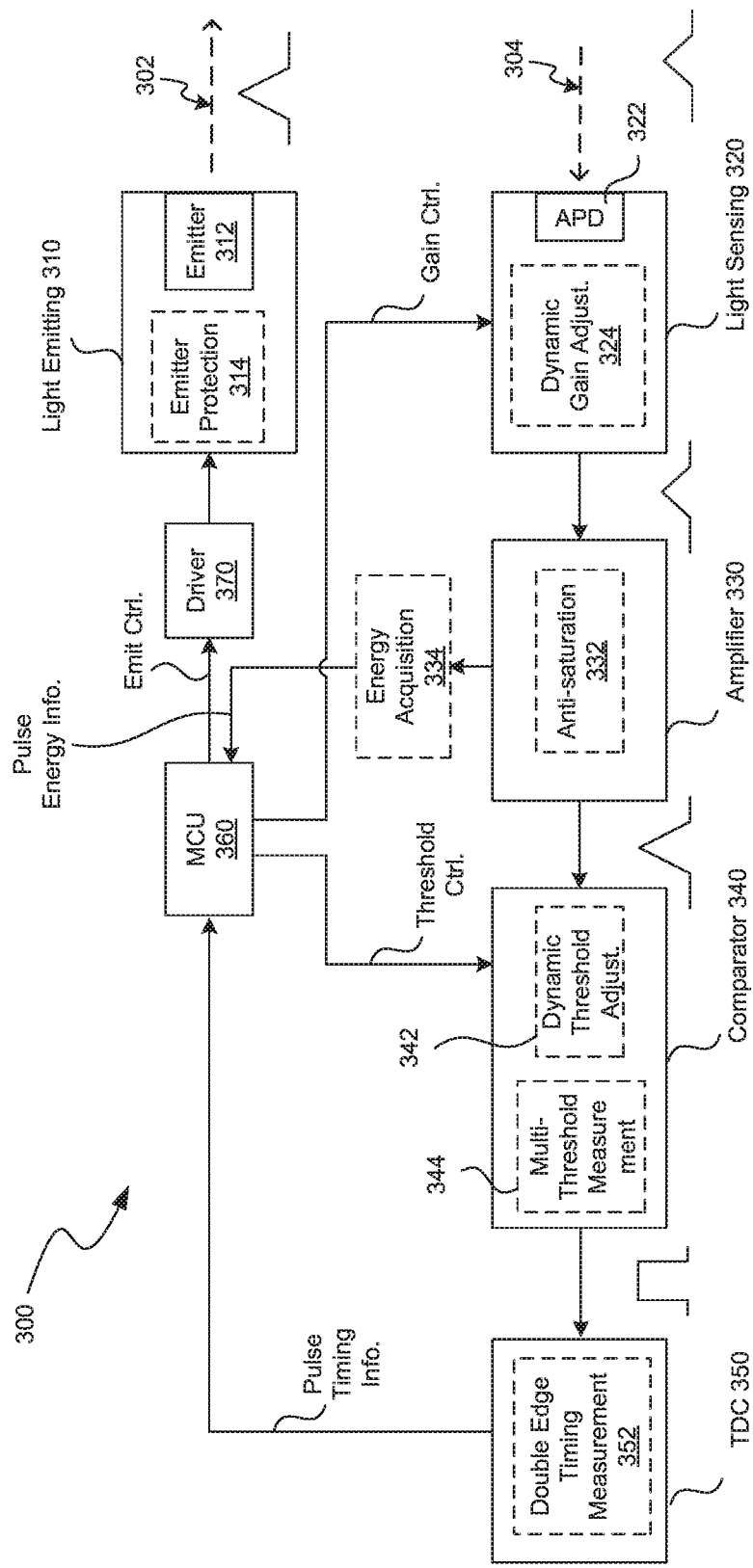
FIG. 3 is a block diagram of a comparator-based LIDAR system, in accordance with an embodiment of the present technology.

FIG. 3 is a block diagram of a comparator-based LIDAR system 300, in accordance with an embodiment of the present technology. As illustrated in FIG. 3, the example LIDAR system 300 includes a light emitting module 310 that emits a beam of light 302 (e.g., a pulsed laser ray), and a light sensing module 320 that detects light 304 that is reflected back from a target object. The LIDAR system 300 further includes an amplifier module 330, a comparator module 340, a time-to-digital converter (TDC) module 350, and a main control unit (MCU) 360. The LIDAR system 300 may also include a driver module 370 for driving the light emitting module 310. It is noted here that the modules illustrated in FIG. 3 are merely examples. The functionality of the modules can be combined, divided, or otherwise rearranged in a suitable manner for a particular field application. For example, in some embodiments, the driver module 370 is incorporated in the light emitting module 310. In some examples, one or more functions of the comparator module 340 may be implemented together with the TDC module 350. Moreover, a number of functions mentioned here with regard to the various modules and/or circuits can be implemented by or together with the MCU 360.

The light sensing module 320 typically includes a photodetector 322 (e.g., an avalanche photodiode (APD) device) that utilizes photoelectric effect of semiconductor materials to convert the reflected light 304 into an analog electrical signal. As illustrated, when the emitted light 302 includes a pulse, the corresponding reflected light 304 should generally have a pulse shape, and so does the analog electrical signal generated by the photodetector 322. Notably, the actual shape of the pulse in the reflected light will be subject to a number of environmental factors, such as the noise e.g., ambient light noise and/or electronic noise, discussed below), the distance of the target object, the surface and color of the target object, and so forth, and therefore the shape illustrated in FIG. 3 is for example purposes only. In a number of embodiments, the light sensing module 330 further includes a dynamic gain adjustment circuit 324. The dynamic gain adjustment circuit 324 can receive a gain control signal from the MCU 360 to adjust the gain of the photodetector 322. Note that, in some embodiments, the photodetector 322 can include built-in capability for gain adjustment, and can be incorporated into the light sensing 320 to perform the functions described herein with respect to the dynamic gain adjustment circuit 324. Dynamic gain adjustment of the light sensing module 320 is discussed in more detail below with respect to FIG. 11.

The amplifier module 330 receives the output of the light sensing module 320, and amplifies the signal for further processing. In a number of embodiments, the amplifier module 330 can include anti-saturation circuitry 332, placed at one or more strategic locations of an operational amplifier (not shown in FIG. 3 for simplicity), for preventing the operational amplifier from becoming saturated when it is exposed to an overwhelmingly powerful signal (e.g., when the scanning LIDAR suddenly encounters a surrounding object that is too close). Among other disclosed components and circuits, the anti-saturation circuitry 332 can greatly increase the LIDAR system 300 acceptable signal strength range (i.e., without resulting in operational amplifier saturation), which resolves or at least reduces the aforementioned "high dynamic range signal saturation" issue. Anti-saturation of the amplifier module 330 is discussed in more detail below with respect to FIGS. 4-7.

The comparator module 340 receives the signal amplified by the amplifier module 330 and compares it against a reference threshold voltage (or a "triggering threshold"). As introduced above with respect to FIG. 2, when the signal exceeds the reference threshold voltage, the output of the comparator module 340 becomes logic high (e.g., VDD); conversely, when the signal does not exceed the reference threshold voltage, the output of the comparator module 340 becomes logic low (e.g., GND). The result of the comparator module 340 is a digitized (e.g., binary), square pulse signal. According to a number of embodiments, the comparator module 340 can include a dynamic threshold adjustment circuit 342. The dynamic threshold adjustment circuit 342 can receive a threshold control signal form the MCU 360 to adjust the triggering threshold of the comparator 340. Dynamic triggering threshold adjustment of the comparator module 340 is discussed in more detail below with respect to FIGS. 8-10.

Additionally, some embodiments of the LIDAR system 300 can include multi-threshold measurement circuitry 334, which can include, for example, a multi-comparator configuration in the comparator module 340. The multi-threshold measurement circuitry 334 can enable to comparator module 340 to perform multiple point measurements on a single light pulse, which enable the LIDAR system 300 to collect additional pieces of information about the reflected light pulse. These additional pieces of information can be used by the LIDAR system 300 to further enhance its functionality, such as increasing the accuracy of pulse timing measurement, or increasing the accuracy of pulse energy estimation. Multi-threshold measurement of the comparator module 340 is discussed in more detail below with respect to FIGS. 21-22.

The TDC module 350 measures the timing of the square pulse signal from the comparator module 340 and output relevant timing information of the signal to the MCU 360. Depending on the implementation, the TDC module 350 may include circuitry 352 for performing double edge timing measurement, which can generate additional information with regard to the pulse. The additional information can also be used to enhance the functionality of the LIDAR system 300. Double edge timing measurement of pulse signal in the TDC module 350 is discussed in more detail below with respect to FIG. 12.

The MCU 360 then estimates the time of flight (i.e., the time difference between when the light pulse 302 is emitted and when the reflected light pulse 304 returns), and calculates the distance to a surrounding object based on the time difference and the estimated speed of light (which largely remains a constant). The MCU 360 (e.g., controller 142, FIG. 1) may be a general-purpose processor or may be application-specific integrated circuitry that provides arithmetic and control functions to implement the techniques disclosed herein on the LIDAR system 300. The processor(s) may include a cache memory (not shown for simplicity) as well as other memories (e.g., a main memory, and/or non-volatile memory such as a solid-state drive). According to some embodiments, the memories may include one or more memory chips or modules, and the processor(s) on the LIDAR system 300 may execute a plurality of instructions or program codes that are stored in its memory.

Furthermore, in accordance with various embodiments, the MCU 360 can dynamically (e.g., during normal operation) and adaptively adjust a number of operating parameters (e.g., the triggering threshold(s) of the comparator module 340 and/or the gain of the light sensing module 320) based on the LIDAR system 300's current environment, and more specifically, based on various information acquired with regard to the reflected light pulse 304. A pulse information acquisition subsystem can be used by the MCU 360 to acquire the pulse information. The pulse information acquisition subsystem may include hardware, software, and/or firmware, and depending on the embodiment, can be a logic entity where the actual components are embodied in the various other modules introduced herein. The pulse information acquisition subsystem of the LIDAR system 300 can include the TDC module 350 mentioned above (for acquiring pulse timing information), and can further include an energy acquisition module 334 to acquire the pulse energy information. The energy acquisition module 334 can implement a number of techniques (and their corresponding circuits) including, for example, deriving energy information based on the double edge timing measurement performed by the TDC module 350, holding peak values of pulse signals, and/or performing integration for calculating energy information in pulse signals. Depending on the implementation, some embodiments of the energy acquisition module 334 process and estimate pulse energy information based on the output from the amplifier module 330. In alternative embodiments, the energy acquisition module 334 may process and estimate the pulse energy information based on the output directly from the light sensing module 320. These energy information acquisition techniques of the pulse energy subsystem are discussed in more detail below with respect to FIGS. 13-18.

In addition, the light emitting module 310 can include an emitter protection circuit 314 to protect the emitter 312 from being damaged, for example, from a voltage spike which may take place when the emitter 312 being driven on or when turned off. Protection of the light emitting module 310 is discussed in more detail below with respect to FIGS. 19-20.

With above in mind and with continued reference to FIG. 3, various modules and circuits embodying the disclosed signal processing techniques are further discussed below.

3. Anti-Saturation Circuitry

Figure 4:
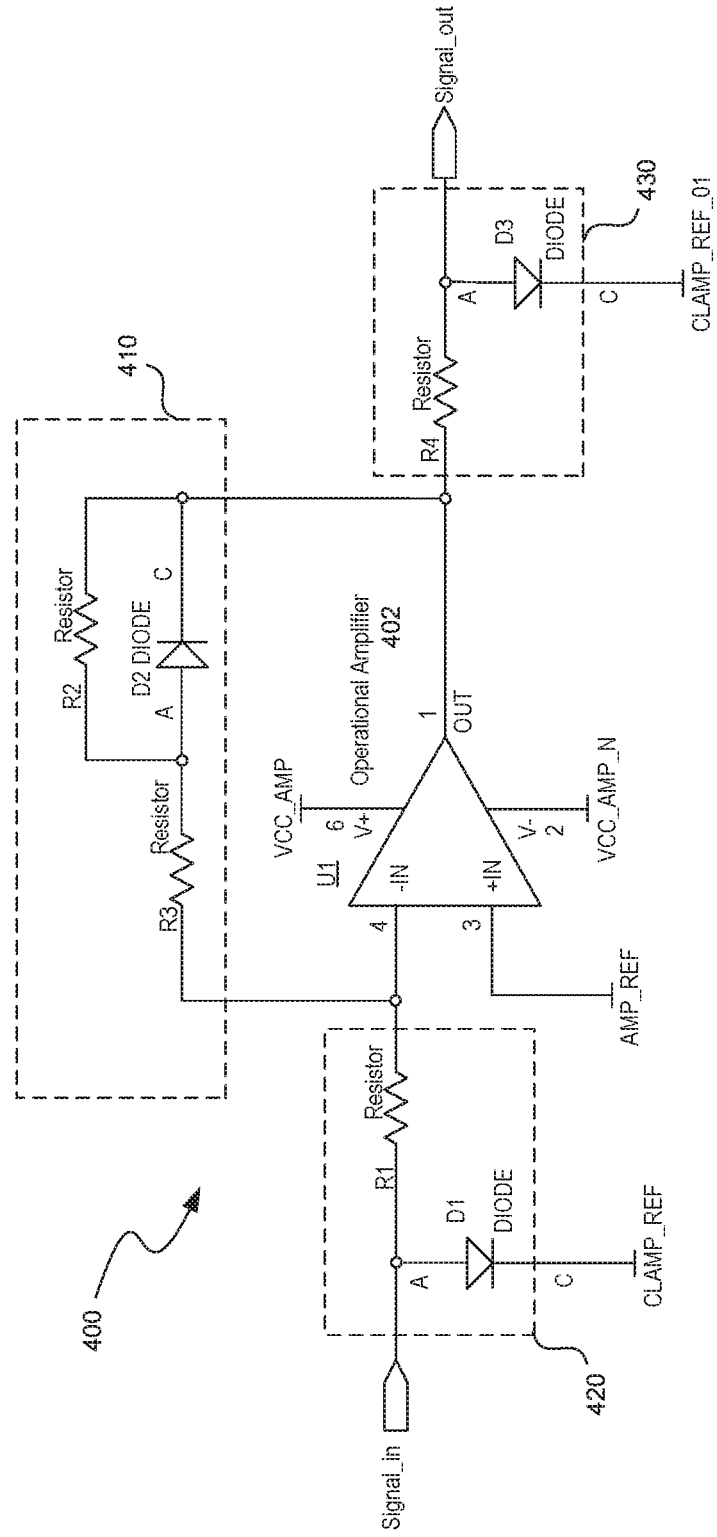
FIG. 4 is a schematic illustration of an amplifier module with anti-saturation circuitry including signal path anti-saturation circuits and operational amplifier feedback loop anti-saturation circuits, in accordance with an embodiment of the present technology.

FIG. 4 is a schematic illustration of an amplifier module 400 (e.g., the amplifier module 330, FIG. 3) with anti-saturation circuitry, in accordance with an embodiment of the present technology. The amplifier module 400 includes an operational amplifier 402 having an inverting input PIN4, a non-inverting input PIN3, and an output PIN1. The anti-saturation circuitry of the amplifier module 400 can include an operational amplifier anti-saturation circuit 410 (e.g., positioned on the feedback loop of the operational amplifier 402), and a pair of signal path anti-saturation circuits. As shown in FIG. 4, the pair of signal path anti-saturation circuits include a pre-amplifier anti-saturation circuit 420 and a post-amplifier anti-saturation circuit 430. Other implementations may include any suitable combination of the circuits 410, 420, and 430, including for example, implementing any one, two, or all three of the circuits 410, 420, and 430 in the amplifier module 400.

Overall, the anti-saturation circuitry is to increase the LIDAR system 300 acceptable dynamic range (i.e., without resulting in operational amplifier saturation) with regard to the signal strength. To cope with a wide dynamic range of signal strength, embodiments of the anti-saturation circuitry are configured in a way that reduces the possibility or avoid saturation. This is because an operational amplifier can saturate if over-driven, which may take the operational amplifier a relatively long time to recover (the length of which often depends on the amount of overdrive). Saturation can render the operational amplifier temporarily inoperable (e.g., because the distorted and/or delayed output from a saturated operational amplifier may adversely affect the measurements from subsequent stages), which in turn can cause the LIDAR system unable to respond to the rapid, short light pulses in an accurate and timely manner. With the anti-saturation circuitry disclosed here, the amplifier module 400 can perform normal amplification for smaller signals; for larger signals, however, the amplification is to be quickly reduced (e.g., in proportion to how large the magnitude of the input signal is), such that the total output amplitude stays within the limitation of the system's normal operations.

a. Signal Path Anti-Saturation Circuit

The signal path anti-saturation circuits are to help keep the input/output of the operational amplifier 402 within the normal operational limits. Specifically, the pre-amplifier anti-saturation circuit 420 is to limit the magnitude of the signal input to the operational amplifier 402. In the example shown in FIG. 4, the pre-amplifier anti-saturation circuit 420 can be implemented based on a diode D1 (e.g., a P-N junction semiconductor diode). On the input signal path for the operational amplifier 402, the diode D1 creates an additional electrical path such that, when there is a signal on the input signal path with a voltage that exceeds the threshold voltage (also known as the "cut-in" voltage or "turn-on" voltage) of the diode D1, the diode D1 becomes conductive, allowing electrical current to flow through the diode D1 (e.g., to a reference voltage, such as the GND). Further, the electrical current increases proportionally with the amount of voltage that exceeds the diode D1's threshold voltage, and therefore the diode D1 effectively clamps the signal voltage at or around the threshold voltage.

It is observed here that the signal output from the light sensing module (e.g., the light sensing module 320, FIG. 3) is similar to a current signal. As shown in the embodiment of FIG. 4, the pre-amplifier anti-saturation circuit 420 further includes an input resistor R1 connected between the signal input Signal_in of the amplifier module 400 and the inverting input PIN4 of the operational amplifier 402. Effectively, the pre-amplifier anti-saturation circuit 420 converts the current signal from the light sensing module 320 to a voltage signal and performs voltage clamping before the operational amplifier 402 amplifies the signal. With the input resistor R1, as the input current increases, so does the voltage differential generated by the input resistor R1. When the voltage differential exceeds the diode D1's threshold voltage, the diode D1 becomes conductive and functions as a as a clamping bypass. In other words, the configuration of the pre-amplifier anti-saturation circuit 420 creates a bypass path for the current when the current is larger. Moreover, the current on the bypass path increases as the magnitude of the signal current, and thereby limiting the maximum current that can flow through the input resistor R1.

The post-amplifier anti-saturation circuit 430 to function as a clamping bypass after the signal amplification of the voltage signal, in order to limit the signal output from the amplifier module 400 to a subsequent stage (e.g., the comparator module 340, FIG. 3). In the example shown in FIG. 4, the post-amplifier anti-saturation circuit 430 includes a diode D3 and an output resistor R4. The diode D3 is connected between the signal output Signal_out of the amplifier module 400 and a reference voltage, and the output resistor R4 is connected between the signal output Signal_out of the amplifier module 400 and the output PIN1 of the operational amplifier 402. Because the signal is a voltage signal, the configuration of having the output resistor R4 before the diode D3 in the post-amplifier anti-saturation circuit 430 can be understood as a bypass path. When the signal is small, The post-amplifier anti-saturation circuit 430 performs no attenuation to the amplified signal. However, when the output signal exceeds the threshold voltage of the diode D3, the bypass starts to function to reduce the voltage by allowing current to flow through the diode D3 (e.g., to a reference voltage, such as the GND), thereby clamping the signal output to the subsequent stage at or around the threshold voltage of the diode D3. In this manner, the post-amplifier anti-saturation circuit 430 limits the magnitude of the input signal for its subsequent stage and avoids the subsequent stage from saturation.

In addition or as an alternative to P-N junction diodes, the diodes can be implemented with other suitable diodes including, for example, Zener diodes or transient voltage suppression (TVS) diodes. In these implementations, the threshold voltage can be analogous to the breakdown voltage of the Zener diodes or TVS diodes.

Figure 5:
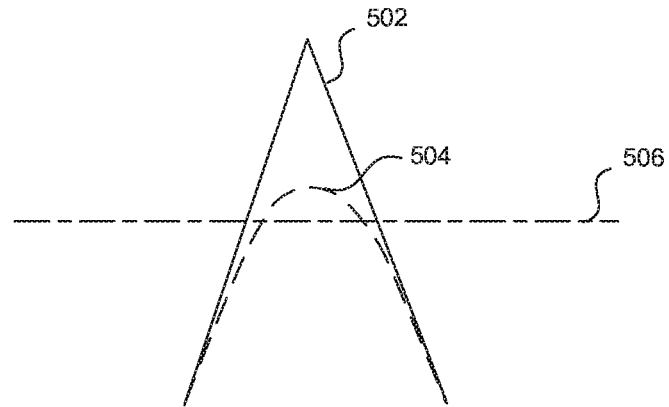
FIG. 5 is an illustration of the effect of the signal path anti-saturation circuits, in accordance with an embodiment of the present technology.

FIG. 5 is an illustration of the effect of the signal path anti-saturation circuits (e.g., the pre-amplifier anti-saturation circuit 420, FIG. 4), in accordance with an embodiment of the present technology. In FIG. 5, signal 502 represents the actual input signal, signal 504 represents the signal after clamping from the pre-amplifier anti-saturation circuit 420, and dashed line 506 represents the threshold voltage of the diode.

b. Operational Amplifier Anti-Saturation Circuit

Referring back to FIG. 4, the operational amplifier anti-saturation circuit 410 is positioned on the feedback loop of the operational amplifier 402, and configured to automatically and adaptively reduce the gain of the operational amplifier 402 when the signal becomes too large, so as to avoid saturation of the operational amplifier 402.

Specifically, in the example shown in FIG. 4, the operational amplifier anti-saturation circuit 410 can include a diode D2, a first resistor R2, and a second resistor R3. The diode D2 is connected in parallel with the first resistor R2. A first terminal of the diode D2 is connected to the output PIN1 of the operational amplifier 402. A second terminal of the diode D2 is connected to a first terminal of the second resistor R3. A second terminal of the second resistor R3 is connected to the inverting input PIN4 of the operational amplifier 402. Together, the operational amplifier anti-saturation circuit 410 forms a clamping bypass for the operational amplifier 402. When the signal is small, so is the voltage differential between the two terminals of the diode D2 (and the first resistor R2, since the first resistor R2 is connected in parallel with the diode D2), and therefore the diode D2 is nonconductive. The equivalent resistance on the feedback loop is at its maximum (i.e., the first resistor R2 plus the second resistor R3). However, when the signal becomes large enough such that the voltage differential between the two terminals of the diode D2 exceeds the threshold voltage of the diode D2, the diode D2 becomes conductive, thereby reducing the equivalent resistance on the feedback loop of the operational amplifier 402. This effectively reduces the gain (or "amplification") of the operational amplifier 402. Notably, the gain of the operational amplifier decreases proportionally as the magnitude of the signal increases. In some embodiments, the gain is reduced until a predetermined minimum gain is reached. This minimum gain is substantially determined by the ratio between the resistor R1 and the resistor R3, assuming that the diode D2 has become fully conductive and its resistance when fully conductive is negligible.

Note that, depending on the operating parameters of the operational amplifier selected for the actual implementation, some operation amplifiers can be more stable than others in low gain configurations. In the embodiments that utilize these more stable operation amplifiers, it may be possible to remove the resistor R3 in the operational amplifier anti-saturation circuit 410. An example of such an operational amplifier anti-saturation circuit is shown in FIG. 6.

Figure 6:
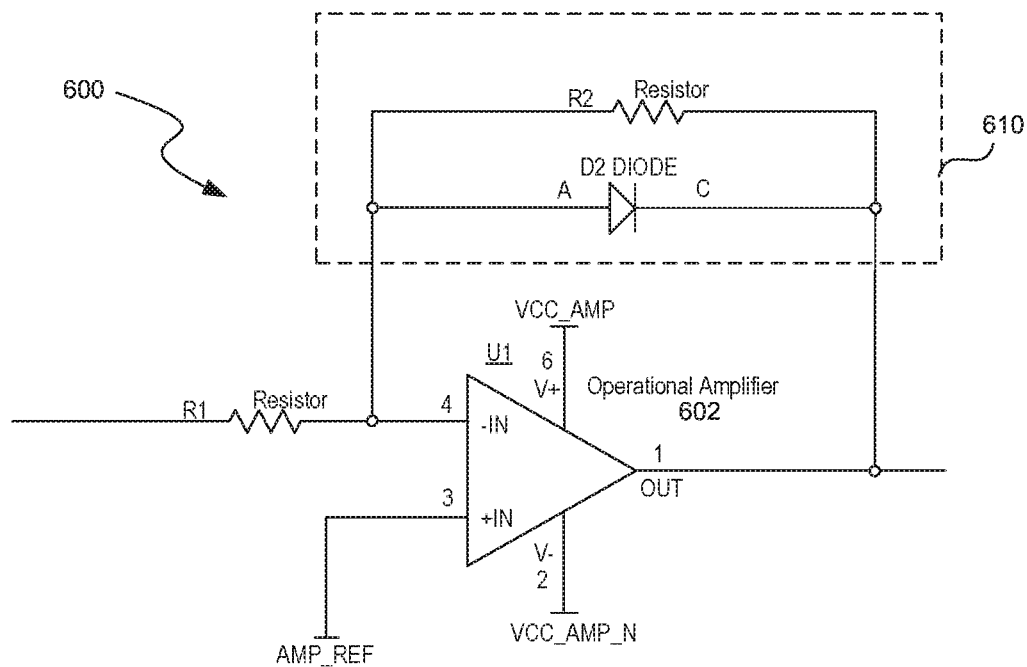
FIG. 6 is a schematic illustration of an amplifier module with another operational amplifier feedback loop anti-saturation circuit, in accordance with an embodiment of the present technology.

FIG. 6 is a schematic illustration of an amplifier module 600 with another operational amplifier feedback loop anti-saturation circuit 610 that includes a diode D2 and only a single resistor R2, in accordance with an embodiment of the present technology. In some embodiments, the amplifier module 600 can be connected to the amplifier module 400 to function as a subsequent amplification stage for the amplifier module 400. In these embodiments, the amplifier modules 400 and 600 can form a multi-stage amplifier.

In the amplifier module 600, a diode D2 is connected in parallel with a resistor R2, and both the diode D2 and the resistor R2 are connected between the input PIN4 of the operation amplifier 602. When the signal is small, so is the voltage differential between the two terminals of the diode D2, and the diode D2 remains nonconductive. The equivalent resistance on the feedback loop is at its maximum (i.e., the resistor R2). However, when the signal becomes large enough such that the voltage differential between the two terminals of the diode D2 exceeds the threshold voltage of the diode D2, the diode D2 becomes conductive, thereby reducing the equivalent resistance on the feedback loop of the operational amplifier 602, for the diode D2 and the resistor R2 being connected in parallel. This effectively reduces the gain (or "amplification") of the operational amplifier 602. Notably, the gain of the operational amplifier decreases proportionally as the magnitude of the signal increases. In some embodiments, the gain is reduced until the magnitude of the output signal does not exceed the maximum voltage drop of the diode D2 in a conductive state.

Figure 7:
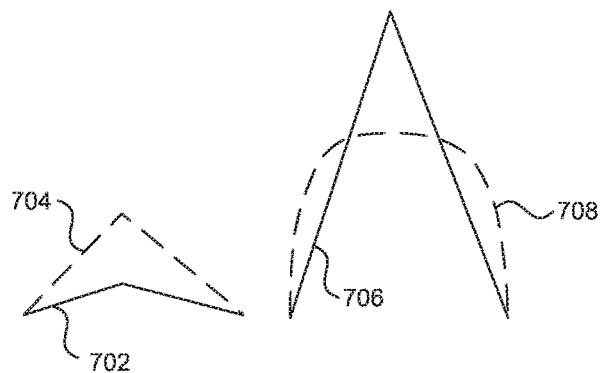
FIG. 7 is an illustration of the effects of the operational amplifier feedback loop anti-saturation circuits, in accordance with an embodiment of the present technology.

FIG. 7 is an illustration of the effects of the operational amplifier feedback loop anti-saturation circuits (e.g., the operational amplifier anti-saturation circuit 410, FIG. 4), in accordance with an embodiment of the present technology. As shown in FIG. 7, signal 702 is a smaller input signal, and 706 is a larger input signal. Signal 704 is an amplified signal of signal 702 by an amplifier module embodying the operational amplifier feedback loop anti-saturation circuits disclosed here, and signal 708 is an amplified signal of signal 706 by the same amplifier module embodiment.

4. Dynamic Adjustment of the Comparator's Triggering Threshold

Recall that the comparator module is to receive the signal amplified by the amplifier module (e.g., the amplifier module 330) and compare it against a reference threshold voltage (or a "triggering threshold"). The output of the comparator module is fed to the TDC module, which measures the timing of the square pulse signal from the comparator module and output relevant timing information to the MCU for calculation. Because the comparator module only generates the square pulse signal when the input signal is larger than the triggering threshold, the timing information measured by the TDC module depends on when exactly the analog input signal on the comparator module crosses the triggering threshold of the comparator module. It is observed here that this exact timing of crossing the triggering threshold is affected by the magnitude of the analog input signal, which may be affected by a number of factors including, for example, different distance of the target object, different reflectivity of the target object, environmental noise, and so forth.

Figure 8:
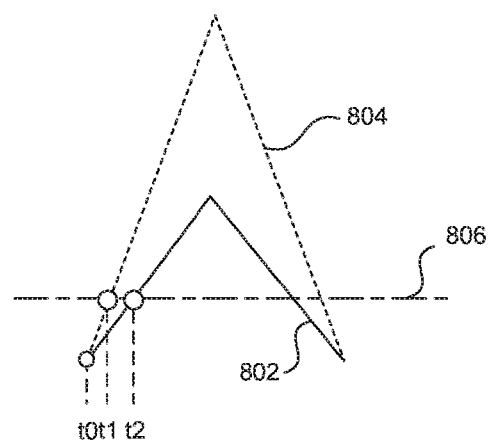
FIG. 8 is an illustration of two analog pulse signals of different magnitude and their effects on the comparator module.

FIG. 8 is an illustration of two analog pulse signals 802 and 804 of different magnitude and their effects on the comparator module (e.g., the comparator module 340). Line 806 represents the triggering threshold for the comparator module. The pulse signal 802 represents a reflected pulse signal with a smaller magnitude, and the pulse signal 804 represents a reflected pulse signal with a larger magnitude. For purposes of discussion herein, assume that the pulse signals 802 and 804 are reflected by target objects of the same distance, and therefore both signals 802 and 804 started at the same time, t0. As shown in FIG. 8, the pulse signal 804 crosses the triggering threshold 806 at time t1, which is earlier than time t2, the time at which the pulse signal 802 crosses the triggering threshold 806. In other words, the difference in magnitude in the analog pulse signals can adversely affect the accuracy of the timing measurements. Therefore, it is preferable to reduce the difference between the time t0 and time t1, and the difference between the time t0 and t2, which can be seen as timing error.

As illustrated in FIG. 8, if the voltage of the triggering threshold 806 can be lowered, then the aforesaid timing error can be reduced accordingly. However, the amplifier module's output may include not only the analog pulse signal but also noise, and therefore the triggering threshold of the comparator module needs to be set higher than the noise to avoid false triggering. Because of the dynamic environment of the UAV application, the noise to which the LIDAR system is exposed can frequently change with the parameters of the surrounding environment including, for example, ambient light intensity, temperature, and so forth. Conventionally, to avoid false triggering, the triggering threshold is to be set at an artificially high level for the worst case scenario such that, even when the LIDAR system is exposed to a predetermined amount of maximum environmental noise, such amount of noise would not false trigger the comparator module. And yet, as explained above, raising the triggering threshold can undesirably degrade the accuracy of the LIDAR system.

Accordingly, embodiments disclosed here include mechanisms for the MCU to dynamically adjust the triggering threshold of the comparator to adapt to the application environment, for example, based on the noise observed by the LIDAR system. In some embodiments, the MCU is configured to adjust the triggering threshold in real time or near real time in response to the amount of noise observed in a given environment. Many embodiments of the MCU can reduce the triggering threshold as much as possible while keeping the probability of false triggering by noise as low as possible, such that the LIDAR system's accuracy and performance may remain largely consistent and satisfactory in any given environment.

Figure 9:
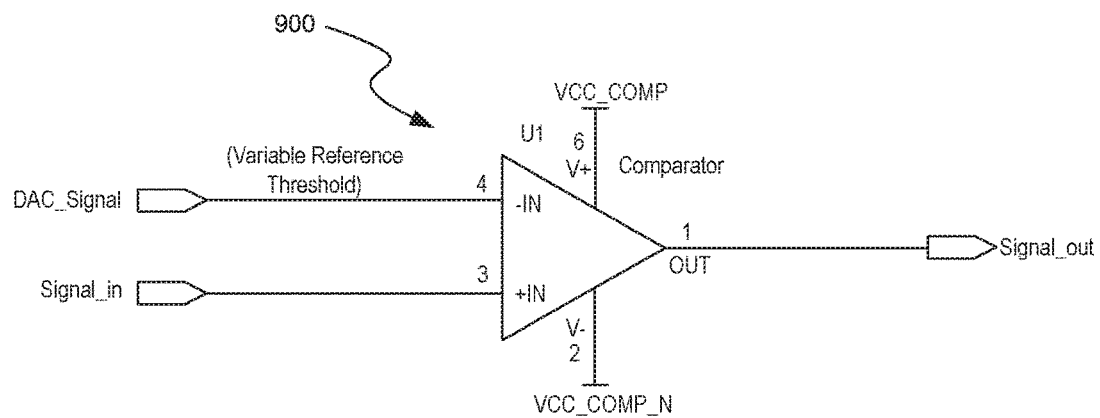
FIG. 9 is a schematic illustration of a comparator module with adjustable reference threshold voltage, in accordance with an embodiment of the present technology.

FIG. 9 is a schematic illustration of a comparator module 900 with adjustable reference threshold voltage, in accordance with an embodiment of the present technology. As shown in FIG. 9, instead of a fixed level of triggering threshold (e.g., in the comparator 240, FIG. 2A), the comparator module 900 can receive a variable reference threshold (e.g., at PIN4). In some examples, the variable reference threshold can be indirectly supplied by another suitable circuit (e.g., a digital-to-analog converter (DAC) circuit, not shown in FIG. 9 for simplicity) that is controlled by the MCU. In some alternative examples, the variable reference threshold can be directly supplied by the MCU.

Figure 10:
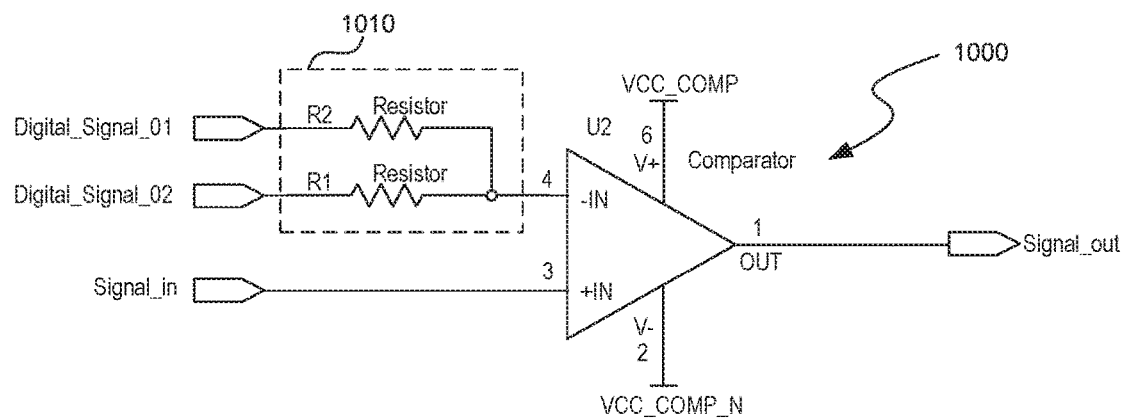
FIG. 10 is a schematic illustration of another comparator module with adjustable reference threshold voltage, in accordance with an embodiment of the present technology.

FIG. 10 is a schematic illustration of another comparator module 1000 with adjustable reference threshold voltage, in accordance with an embodiment of the present technology. The comparator module 1000 includes a resistor network 1010 which, in the example shown in FIG. 10, includes two resistors R1 and R2. The adjustment of the triggering threshold of the comparator module 1000 can be achieved, for example, through the MCU sending different combinations of digital signals to the resistor network 1010, which can result in a variety of voltage levels on PIN4 as the triggering threshold. Note that the granularity of adjustment of the triggering threshold generally increases with the number of the resistors that are in the resistor network 1010, subject to the number of signals that the MCU is capable of generating in order to individually control each resistor in the resistor network 1010.

5. Dynamic Gain Adjustment of the Light Sensing Module

Figure 11:
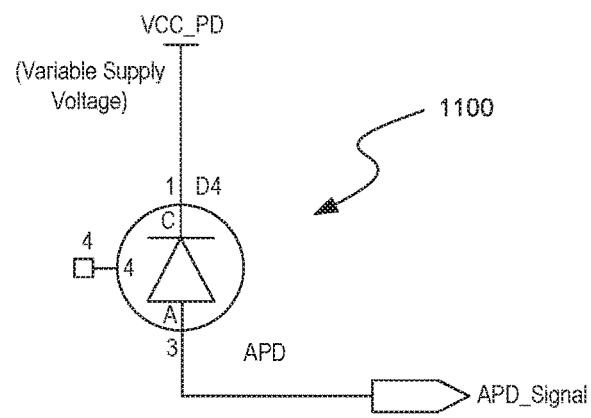
FIG. 11 is a schematic illustration of a light sensing module with adjustable gain, in accordance with an embodiment of the present technology.

FIG. 11 is a schematic illustration of a light sensing module 1100 with adjustable gain, in accordance with an embodiment of the present technology.

As previously discussed, the light sensing module typically includes a photodetector (e.g., an avalanche photodiode (APD) device) that utilizes photoelectric effect of semiconductor materials to convert the reflected light into an analog electrical signal. In a number of embodiments, the APD needs to receive at least a certain amount of voltage to ensure that it has sufficient gain to detect weak light signals. However, the gain cannot be too large, either, or otherwise the APD may suffer damage. The supply voltage for the APD needs to be maintained in a certain range.

Accordingly, embodiments disclosed here include mechanisms for the MCU to dynamically adjust the gain of the APD in the light sensing module 1100 to adapt to the application environment, for example, based on the noise observed by the LIDAR system. In some embodiments, the MCU is configured to adjust the gain of the APD in real time or near real time in response to the amount of noise observed in a given environment. In the example shown in FIG. 11, instead of a fixed supply voltage, the MCU can control the supply voltage to the APD so as to dynamically control the APD's gain.

It is further noted that, the adjustment to the gain of the APD can affect the magnitude of both the noise and the pulse signal. When the gain of the APD increases, the magnitude for both pulse signal and the noise can also increase; conversely, when gain decreases, the magnitude for both pulse signal and the noise can also decrease. Thus, some embodiments of the MCU can utilize certain heuristics to selectively control the APD gain versus the comparator's triggering threshold in order to optimize the LIDAR's accuracy and performance. For example, in certain implementations, when the noise level exceeds the comparator's triggering threshold, the MCU can reduce the APD gain (in addition or as an alternative to adjusting the comparator's threshold) to reduce the magnitude of both the noise and pulse signal, in order to be able to set the comparator's triggering threshold at a lower level while not have the noise falsely triggering the comparator. These heuristics and considerations are discussed in more detail below.

6. Noise Type Based Adjustment of APD Gain and Comparator Triggering Threshold As discussed above, to maintain the accuracy of timing measurement on the detected pulse signal, it is preferable to remove or at least reduce the possibility of false triggering of the comparator module from noise. Accordingly, the disclosed MCU can dynamically control the APD gain and/or the comparator's triggering threshold based on the noise observed by the MCU. For the convenience of discussion, the examples herein refer to the APD gain as a specific example for controlling the gain of the photodetector device; however, it is to be understood that the introduced techniques are similarly applicable for dynamically control any types of gains of suitable photodetectors in the light sensing module.

There are at least two types of noise that can be received by the comparator module: the noise from ambient light, and the noise from the electronics in the LIDAR system. The electronic noise is typically more consistent, that is, stay at a level that does not fluctuate largely with the surrounding environment of the LIDAR system. Example factors that affect the electronic noise can include circuit gain, temperature, or other operating parameters in the LIDAR circuitry. On the other hand, the ambient light noise can vary widely with the surrounding environment: the brighter the environment is, the higher the ambient light noise becomes. Example factors that affect the ambient light noise can include ambient light intensity, the type of emitted light, and the wavelength of the emitted light.

The total noise observed by the LIDAR system is at least the summation of the ambient light noise and the electronic noise. Because ambient light noise is directly proportional to APD's gain to the power of two thirds (i.e., ambient light noise $\propto$ gain$^{2/3}$), reducing the APD gain can reduce the portion of ambient light noise in the total noise. That is to say, when ambient light is determined to be the dominant source (e.g., over 50%) of noise, it is observed here that reducing the APD gain can increase the signal-to-noise ratio (SNR) of the LIDAR system, because it can reduce the level of ambient light noise, avoiding such noise to falsely trigger the comparator module. Additionally, as previously discussed, raising the triggering threshold of the comparator module can similarly avoid false triggering by the noise from the amplifier module.

Therefore, in accordance with one or more embodiments, the MCU can determine whether ambient light is a dominant source of noise. When the ambient light is determined by the MCU to be the dominant source of the noise, the MCU can choose to perform and/or prioritize the reduction of the APD gain for reducing possible interference (e.g., false triggering) from the noise. In addition, when the ambient light is determined by the MCU not to be the dominant source of the noise (e.g., at a similar level of the electronic noise), the MCU can choose to perform and/or prioritize the increase of the triggering threshold of the comparator module for reducing possible interference (e.g., false triggering) from the noise.

In some embodiments, the LIDAR system can include an ambient light sensor for detecting the intensity of the ambient light, and the MCU can make dynamic adjustments of the APD gain and/or the comparator triggering threshold accordingly.

Further, the MCU can be configured to determine whether the noise is causing false triggering by one or more of the following techniques:

(1) The MCU can determine whether the noise is falsely triggering the comparator based on the waveform of the comparator's output. When the noise is large enough to cause false triggering, the waveform can include random spikes. When the waveform is predominantly random spikes (e.g., exceeding a predetermined percentage) and without regularity, the MCU can determine that the main source of noise is ambient light.

(2) The MCU can employ a root-mean-square (RMS) detector (not shown in the figures for simplicity) to measure the noise level. The RMS detector can acquire the power information of the noise at a certain frequency range.

(3) In the embodiments with multi-comparator configurations (discussed in more detail below with respect to FIGS. 21-22), if the difference between the measured time for a comparator with a lower threshold and the measured time for a comparator with a higher threshold is random and/or exceeding a predetermined range, the MCU can determine that the noise level has exceeded at least the lower threshold.

7. Double Edge Timing Measurement of Pulse Signal

Figure 12:
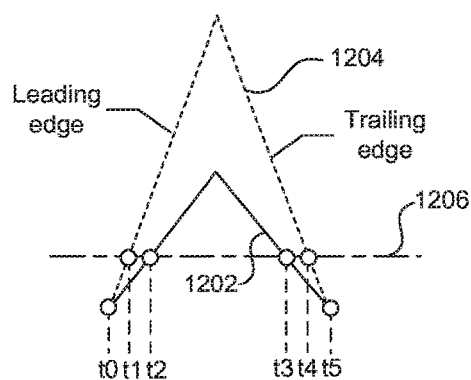
FIG. 12 is an illustration of performing double edge timing measurement for pulse signals, in accordance with an embodiment of the present technology.

FIG. 12 is an illustration of performing double edge timing measurement for pulse signals, in accordance with an embodiment of the present technology. Conventionally, timing information for the pulse signal is only to be measured on the timing of the leading (e.g., rising) edge of the pulse. This is because how LIDAR system works is to measure the time-of-flight (TOF), which is determined by when the reflected pulse returns to the LIDAR system's light sensor. However, as previously discussed with respect to FIG. 8, the magnitude of the reflected pulse signal may be affected by a number of factors including, for example, different distance of the target object and different reflectivity of the target object. Further, the difference in magnitude in the analog pulse signals can adversely affect the accuracy of the timing measurements. As shown in FIG. 12, the difference between the time t0 and t1 and the difference between time t0 and t2 represent timing error between an actual timing and a measured timing of leading edges.

Accordingly, one or more embodiments of the disclosed LIDAR system can perform double edge timing measurement of a pulse signal, and perform timing error compensation based on the measurement. For purposes of discussion here, double edge means both the leading and trailing edges of a pulse signal. The terms "leading" and "trailing" are used herein with respect to time, where an earlier time is "leading." In the example of FIG. 12, signal 1204's leading edge is a rising edge, and its trailing edge is a falling edge. The terms "rising" and "falling" are used herein with respect to amplitude, where a positive amplitude is "rising." Signal 1204's leading edge crosses the triggering threshold 1206 at time t1, and signal 1204 falling edge crosses the triggering threshold 1206 at time t4. Similarly, signal 1202's leading edge crosses the triggering threshold 1206 at time t2, and signal 1202's falling edge crosses the triggering threshold 1206 at time t3.

As shown in FIG. 12, signal 1204's magnitude is larger than signal 1202's, and therefore time t1 is earlier than time t2. Nonetheless, because the same reason that signal 1204's magnitude is larger than signal 1202's, time t4 is later than time t3. In other words, when a signal is larger (e.g., signal 1204), the measured timing for its leading edge (e.g., t1) can be closer to the actual timing (e.g., t0) than the measured timing for the leading edge for a smaller signal (e.g., t2). Based on this observation, after the LIDAR system performing double edge timing measurement, the MCU can use the timing information of the trailing edge in conjunction with the timing information of the leading edge to estimate magnitude of the pulse, to compensate timing error, and/or to estimate a surface profile (e.g., reflectivity) of a target object.

As an example, to estimate the magnitude (or energy information) of the pulse, the MCU can acquire the timing difference of both the leading edge and the trailing edge of a pulse signal, and perform the estimation based on the difference. This time difference (or time duration) also represents the width of the measured pulse. If the measured timing difference for a pulse signal is larger (e.g., time t1 to time t4), then the MCU estimates that the signal has a larger magnitude (e.g., signal 1204). Likewise, if the measured timing difference for a pulse signal is smaller (e.g., time t2 to time t3), then the MCU estimates that the signal has a smaller magnitude (e.g., signal 1202). Depending on the embodiment, the MCU can estimate the magnitude by comparing and cross referencing the measured timing difference against a database or a lookup table that has existing data (e.g., measured in a controlled environment), by calculating based on an established model, by using a predetermined magnitude estimation formula, or by another suitable way to estimate the magnitude based on the measured timing difference of the double edges of a pulse signal.

Furthermore, the MCU can use the timing information acquired from double edge timing measurement to compensate for the timing error. Because the MCU can estimate the magnitude of the pulse signal, it can further estimate the timing error between the actual timing and the measured timing of the leading edge (e.g., time t0 to time t1, or time t0 to time t2) based on the estimated magnitude of the pulse signal. When the magnitude of the pulse signal is larger, there may be a smaller timing error (e.g., time t0 to time t1) for the MCU to compensate. Conversely, when the magnitude of the pulse signal is smaller, there may be a larger timing error (e.g., time t0 to time t2) for the MCU to compensate. The MCU can estimate the timing error by comparing and cross referencing the estimated magnitude against a database or a lookup table that has existing data (e.g., measured in a controlled environment), by calculating based on an established model, by using a predetermined timing error estimation formula, or by another suitable way to estimate timing error based on the estimated magnitude of a pulse signal. In one or more embodiments, an amount of the timing error that the MCU compensates is inversely proportional to an amount of energy indicated in the pulse energy information.

In addition, the MCU can use the timing information acquired from double edge timing measurement to estimate a surface profile (e.g., reflectivity) of a target object. Specifically, for example, after compensating for timing error, if the MCU determined that two signals have been reflected from two objects of the same distance, and yet one signal has a smaller magnitude than the other signal, then the MCU can determine that the object that caused the weaker reflected signal has a surface with a lower reflectivity (e.g., darker) than the other object. Similar to how the MCU estimate magnitude and/or timing error, the MCU can estimate the surface profile of a target object by comparing and cross referencing against a database or a lookup table that has existing data (e.g., measured in a controlled environment), by calculating based on an established model, by using a predetermined estimation formula, or by another suitable way to estimate surface profile information of an object based on the double edge timing measurement.

8. Pulse Signal Energy Information Acquisition

The energy acquisition module (e.g., module 334, FIG. 3) in the disclosed LIDAR system can implement a number of techniques for acquiring energy information of a pulse signal. The energy of a signal can be represented by the area of the signal's waveform. That is to say, for a pulse signal, the energy information includes the amplitude of the pulse and the width of the pulse. Among other purposes, the MCU can utilize these pieces of information regarding the pulse to improve the performance of the LIDAR system including, for example, perform timing error compensation and/or to estimate a surface profile of an object. According to one or more of the disclosed embodiments, examples techniques for acquiring pulse signal energy information can include deriving energy information based on the double edge timing measurement (discussed above), holding peak values of pulse signals, and/or performing integration for calculating energy information in pulse signals.

a. Peak Holding Circuit

Figure 13:
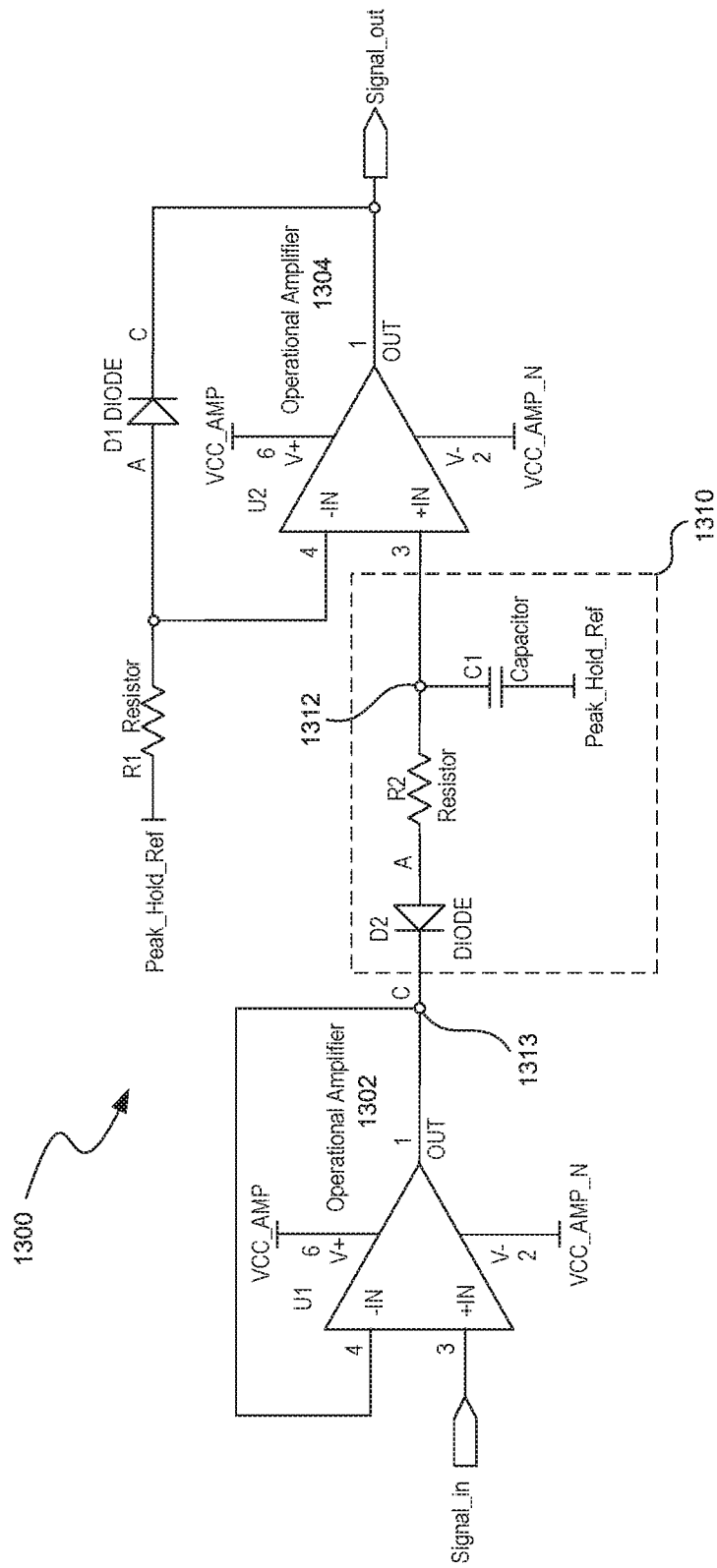
FIG. 13 is a schematic illustration of a peak holding circuit, in accordance with an embodiment of the present technology.
Figure 16:
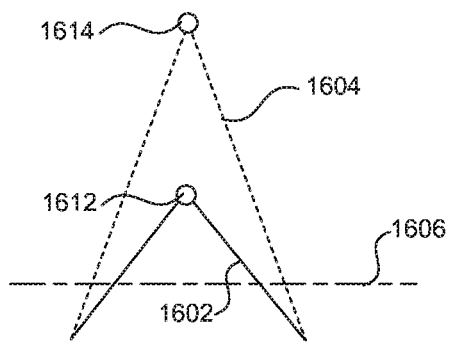
FIG. 16 is an illustration of the relationship between measured timing information of a pulse and the magnitude of the pulse.

FIG. 13 is a schematic illustration of a peak holding circuit 1300, in accordance with an embodiment of the present technology, and FIG. 16 is an illustration of the relationship between measured timing information of a pulse and the magnitude of the pulse. As discussed with FIGS. 8 and 12, the difference in magnitude in the analog pulse signals can adversely affect the accuracy of the timing measurements. The different timing between the measured leading edge and the actual leading edge of the pulse can be a source of timing error. Because the magnitude of the pulse can also be measured by the peak of the signal, the energy acquisition module can include the peak holding circuit 1300 to acquire peak information (e.g., peak 1614 or peak 1612) for a pulse signal (e.g., signal 1604 or signal 1602).

As shown in FIG. 13, the peak holding circuit 1300 includes a peak holding core 1310, which includes a diode D2, a resistor R2, and a capacitor C1. The peak holding circuit 1300 also includes a first operational amplifier 1302, and a second operational amplifier 1304. In some embodiments, the first operational amplifier 1302 receives signal and passes the signal to the peak holding core 1310, which in turn passes to the second operational amplifier 1304.

Specifically, in some embodiments, the first operational amplifier 1302 receives the signal at its non-inverting input PIN3, and the output PIN1 of the first operational amplifier 1302 is connected to the inverting input PIN4 to form a feedback loop for the first operational amplifier 1302. The output of the first operational amplifier 1302 is connected to the peak holding core 1310. At the peak holding core 1310, one terminal of the diode D2 is to receive the signal to be measured, and the other terminal of the diode D2 is connected in series with one terminal of the resistor R2. The other terminal of the resistor R2 is connected (at node 1312) with the capacitor C1, which in turn is connected to a reference voltage (e.g., GND or a predetermined voltage). The other terminal of the resistor R2 (at node 1312) also functions as the output of the peak holding core 1310. The second operational amplifier 1304 receives the signal output from the peak holding circuit 1310 at the non-inverting input PIN3. The feedback loop of the second operational amplifier 1304 further includes a diode D1. Additionally, the inverting input of the second operational amplifier 1304 is connected to a resistor R1, which in turn is connected to another reference voltage (e.g., GND or a predetermined voltage).

Note that the embodiment of the peak holding circuit 1300 as shown in FIG. 13 is configured to measure and hold the peak information for a pulse signal with negative amplitude. The peak holding circuit 1300 can be reconfigured for measuring peak information for a pulse signal with positive amplitude, for example, by reversing the diodes D1 and D2.

The disclosed peak holding circuit 1300 is advantageous over conventional peak holding circuits in its ability to capture the peak information for a very short pulse signal (e.g., tens nanoseconds to a few nanoseconds) and its ability to continuously capture the peak information without needing a relatively long recovery time (e.g., 20 to 30 nanoseconds). More specifically, in many conventional circuits, the diode D2 is included in the feedback loop of the first operational amplifier 1302 (e.g., between the output of the amplifier 1302 and node 1313). In these circuits, the operational amplifier 1302 is prone to saturate because after the input signal has peaked and starts to return to a baseline voltage (e.g., zero volt), the diode D2 may start to block the feedback loop, which may result in the operational amplifier 1302 saturated. As mentioned above, when an operational amplifier saturates, it would take a relatively long time for the operational amplifier to recover, which may cause the LIDAR system to miss a subsequent pulse signal. The saturation issue of the operational amplifier 1302 can reduced or solved by moving the diode D2 out of the feedback loop of the operational amplifier 1302. However, doing so may create a voltage offset on the peak information. This offset can be compensated by the operational amplifier 1304 together with the diode D1.

In some variations, depending on the design of the entire circuitry of the LIDAR system, the first operational amplifier 1302 may be omitted. Additionally or alternatively, for example, when the design tolerates lesser accuracy on the peak information and if circuits subsequent to the output of the peak holding core 1310 can be of high impedance state, then the second operational amplifier 1304 and/or the resistor R2 may be omitted. Also, various embodiments can include controllable switches (e.g., transistors) for the capacitor C1 to release the electrical charges after the MCU collects the peak information, for example, via an analog-to-digital converter (ADC).

Note that, in at least one embodiment, the reference voltage for the peak holding circuit 1300 can be set as the same level as the steady state voltage of the system (i.e., when there is no input signal to measure). In some of embodiments that are to hold the peak values for negative amplitude signals, the reference signal can be slightly larger than the steady state voltage of the system to reduce the measuring dead zone caused by the voltage drop from the diode D2. Similarly, in some of embodiments that are to hold the peak values for positive amplitude signals, the reference signal can be slightly smaller than the steady state voltage of the system to reduce the measuring dead zone caused by the voltage drop from the diode D2.

b. Integrator Circuit

Figure 14:
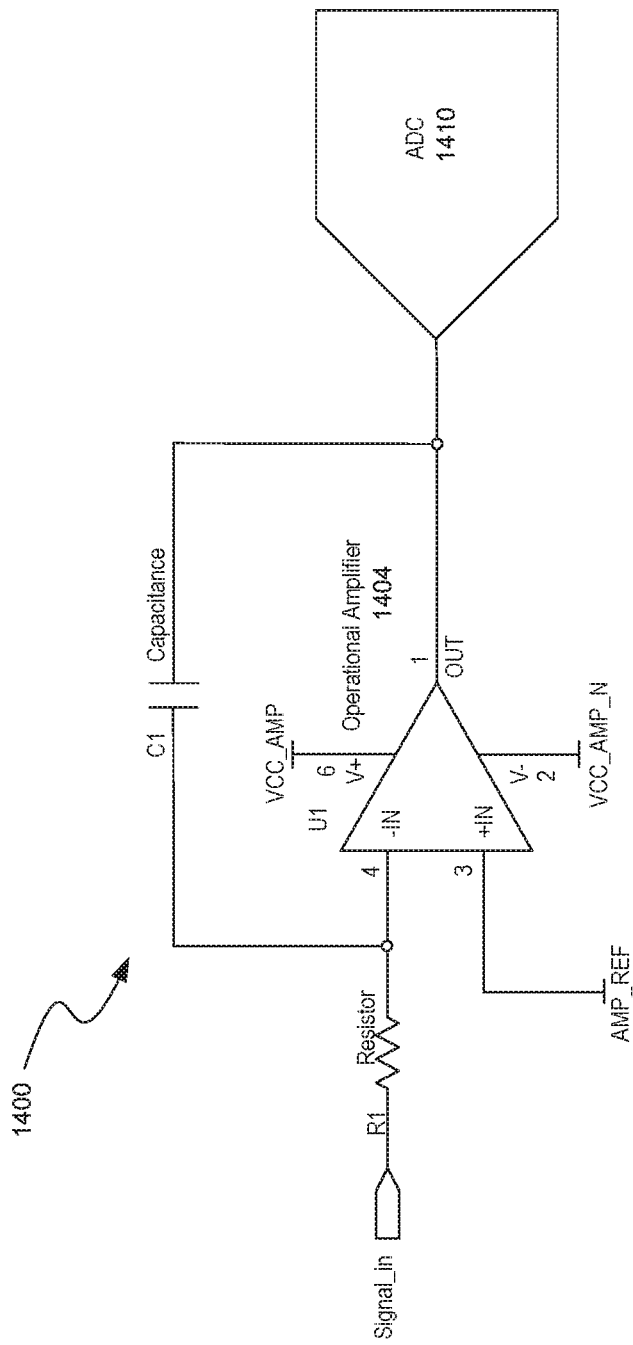
FIG. 14 is a schematic illustration of an integrator circuit, in accordance with an embodiment of the present technology.
Figure 17:
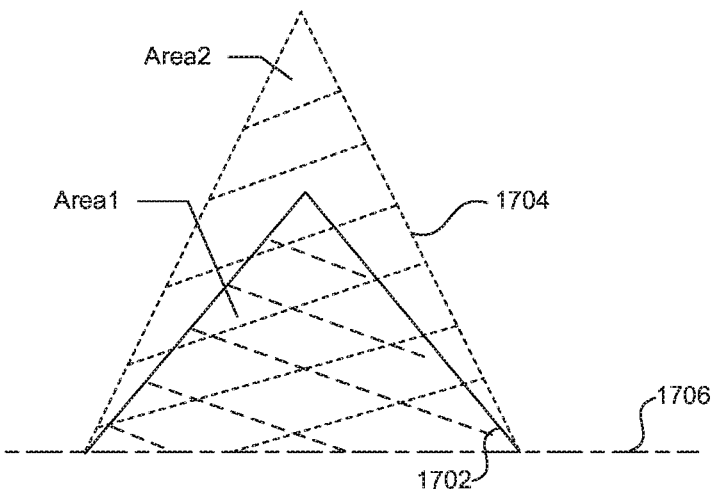
FIG. 17 is an illustration of the relationship between measured timing information of a pulse and the energy of the pulse.

FIG. 14 is a schematic illustration of an integrator circuit 1400, in accordance with an embodiment of the present technology, and FIG. 17 is an illustration of the relationship between measured timing information of a pulse and the energy of the pulse.

The integrator circuit 1400 includes an operational amplifier 1404, a resistor R1 on the inverting input PIN4 of the operational amplifier 1404, and a capacitor C1 on the feedback loop of the operational amplifier 1404. The non-inverting input PIN3 of the operational amplifier 1404 is connected to a reference voltage. According to one or more embodiments, the reference voltage is at the same level as the baseline voltage (e.g., line 1706) for the pulse signal. When there is a pulse signal (e.g., signal 1702 or signal 1704), the capacitor C1 on the integrator circuit 1400's feedback loop starts to charge, and the final result on the output of the operational amplifier 1404 becomes the area of the pulse (e.g., area 1 for signal 1702, or area2 for signal 1704).

With the integrator circuit 1400, the ADC (through which the MCU accesses the area information) need not be a high speed ADC (e.g., with a sampling rate that exceeds one GSPS).

c. Pulse Expansion Circuit

Figure 15:
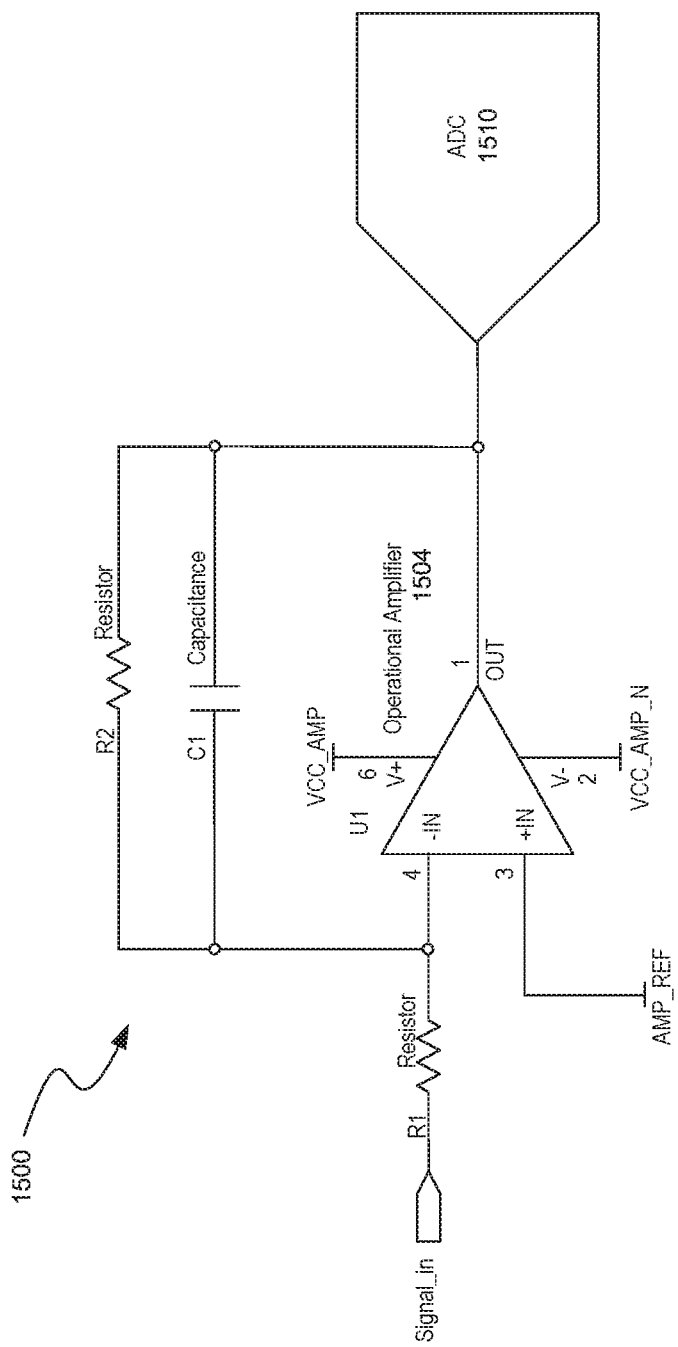
FIG. 15 is a schematic illustration of a pulse expansion circuit, in accordance with an embodiment of the present technology.
Figure 18:
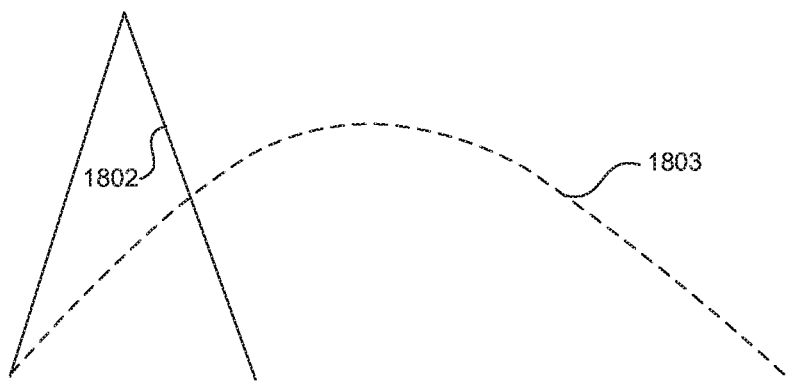
FIG. 18 is an illustration of a pulse signal before and after pulse expansion.

FIG. 15 is a schematic illustration of a pulse expansion circuit 1500, in accordance with an embodiment of the present technology, and FIG. 18 is an illustration of a pulse signal before and after pulse expansion.

As shown in FIG. 18, if pulse signal 1802 can be expanded to signal 1803, that is, to become a pulse signal with a wider pulse width, then information regarding the pulse signal can be gathered with an ADC of a lower speed. Accordingly, the pulse expansion circuit 1500 can include, on its feedback loop, a resistor R2 and a capacitor C1 connected together in parallel, for expanding a waveform of a given pulse. The combination of the resistor R2 and the capacitor C1 can enable the operation amplifier 1504 to perform both amplification and pulse expansion on the input pulse signal.

9. Protection of Light Emitting Module

It is observed that, when the light emitter (e.g., emitter 312, FIG. 3) in the LIDAR system being driven on or when turned off by the MCU, a high voltage pulse or a voltage spike may take place at where the light emitter is located, which may damage the light emitter.

Figure 19:
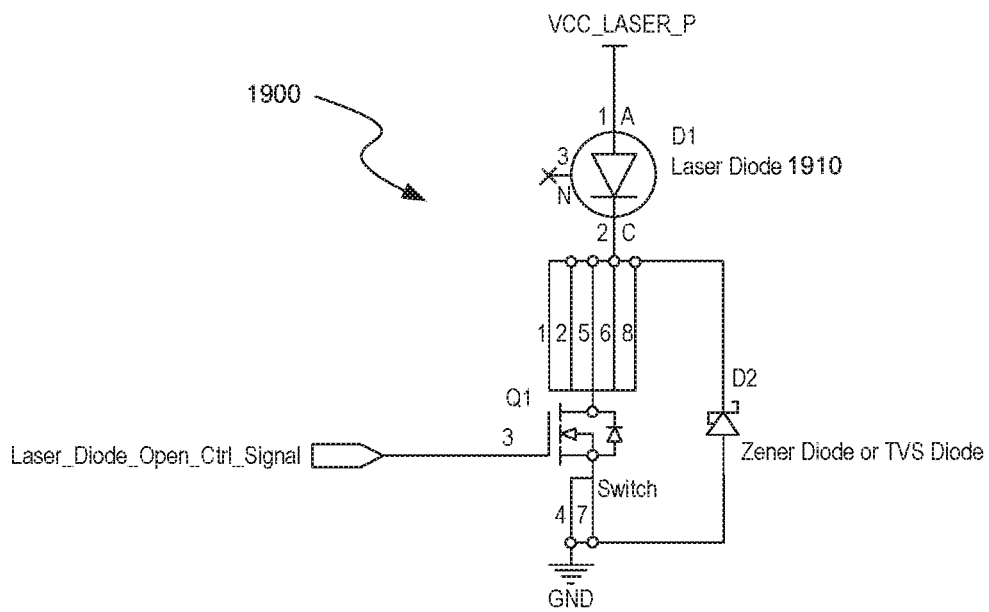
FIG. 19 is a schematic illustration of an emitter protection circuit in a light emitting module, in accordance with an embodiment of the present technology.

FIG. 19 is a schematic illustration of an emitter protection circuit 1900 in a light emitting module, in accordance with an embodiment of the present technology. As shown in FIG. 19, the emitter protection circuit 1900 includes a suitable diode D2 (e.g., a Zener diode or a TVS diode). The diode D2 may be connected in parallel with a control switch circuit for the MCU to control (e.g., turn on or off) the light emitter 1910. The control switch circuit can be transistor based. In one or more embodiments, the protection circuit 1900 may be positioned between the light emitter 1910 and the ground voltage. When the light emitter 1910 experiences too high of a voltage (e.g., from a voltage spike), the diode D2 turns conductive and reduces the voltage, thereby protecting the light emitter 1910.

Figure 20:
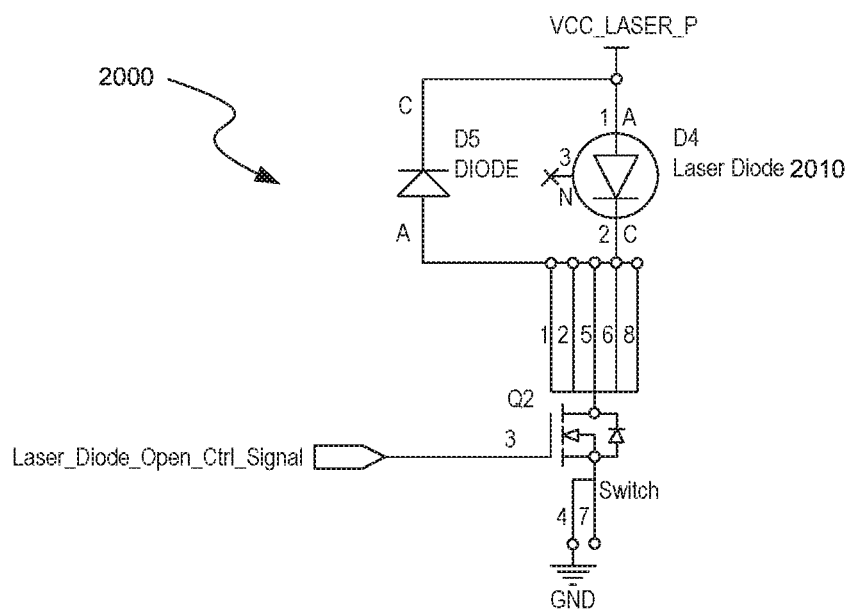
FIG. 20 is a schematic illustration of another emitter protection circuit in a light emitting module, in accordance with an embodiment of the present technology.

FIG. 20 is a schematic illustration of another emitter protection circuit 2000 in a light emitting module, in accordance with an embodiment of the present technology. The protection circuit 2000 includes a suitable diode D5 and is connected in parallel with the light emitter 2010. A control switch circuit for the MCU to control (e.g., turn on or off) the light emitter 2010 is positioned between the light emitter 2010 and the ground. The control switch circuit can be transistor based. When the light emitter 2010 experiences too high of a voltage (e.g., from a voltage spike), the diode D5 turns conductive and reduces the voltage, thereby protecting the light emitter 2010.

10. Multi-Comparator Configuration for Comparator Module

Figure 21:
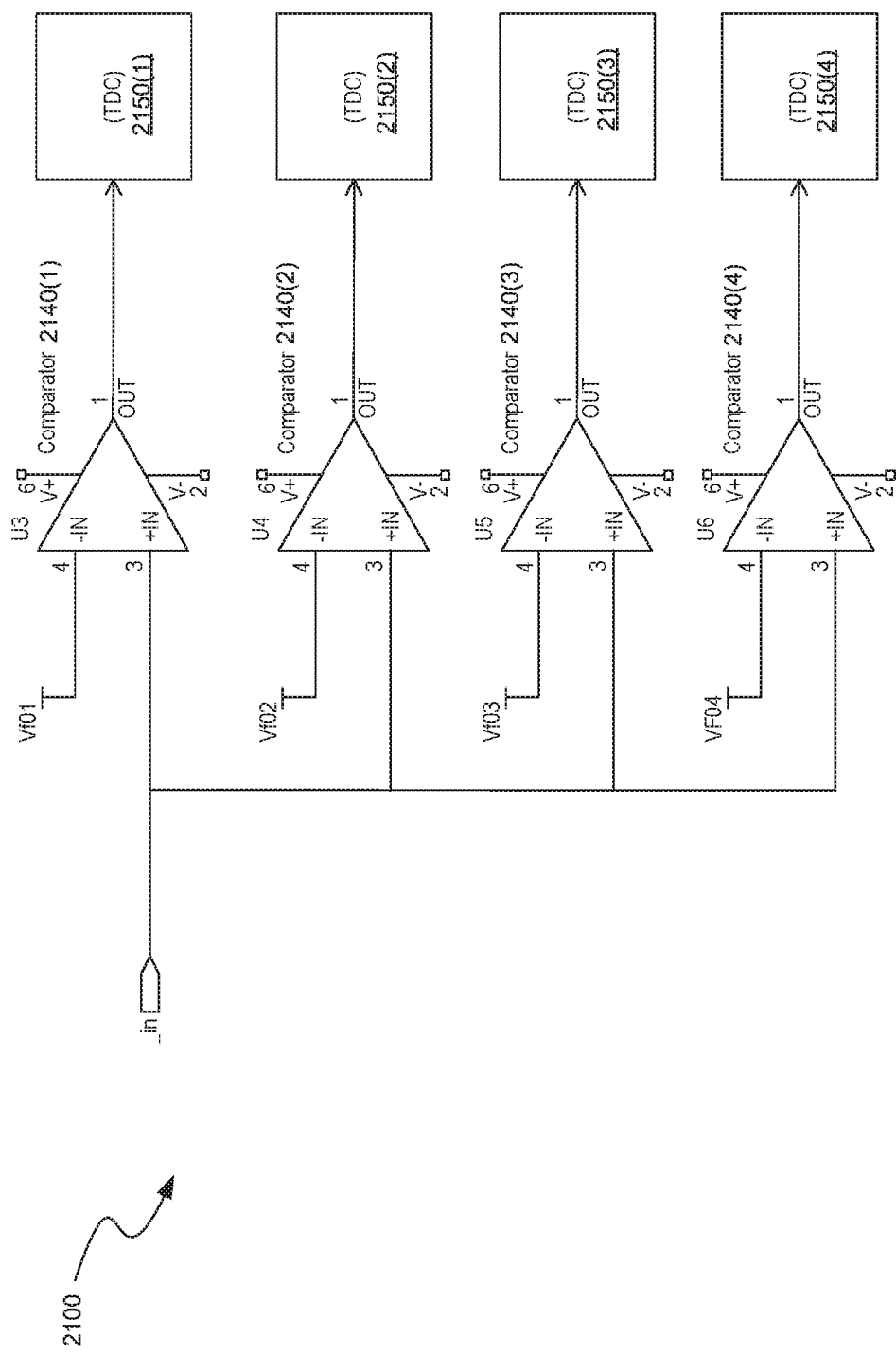
FIG. 21 is a schematic illustration of a comparator module with a multi-comparator configuration (e.g., for sampling additional information from a pulse signal), in accordance with an embodiment of the present technology.
Figure 22:
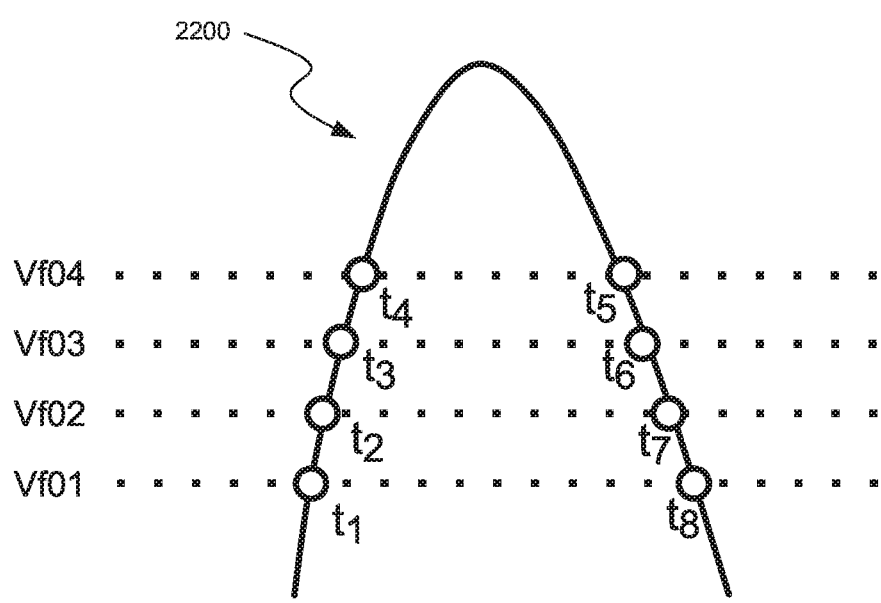
FIG. 22 is an illustration of multiple sample points on a pulse signal with the comparator module of FIG. 21.

FIG. 21 is a schematic illustration of a comparator module 2100 with a multi-comparator configuration (e.g., for sampling additional information from a pulse signal), in accordance with an embodiment of the present technology, and FIG. 22 is an illustration of multiple sample points on a pulse signal 2200 with the comparator module 2100 of FIG. 21.

As previously discussed, the disclosed embodiments of LIDAR system can include a comparator module that has a multi-comparator configuration to acquire additional pulse information (e.g., multiple point timing measurements) on a single light pulse. Specifically, in one or more embodiments, a comparator module with multi-comparator configuration includes two or more comparators, each of the comparators are coupled to the same input to perform timing measurement on the same light pulse, but each of the comparators can have a different triggering threshold.

In the example shown in FIG. 21, the comparator module 2100 includes a total of four comparators, 2140(1)-2140(4). Each of the comparator is connected to its respective individual TDC, 2150(1)-2150(4). For example, the comparator 2140(1) is connected to an individual TDC 2150(1), the comparator 2140(2) is connected to an individual TDC 2150(2), and so forth. Additionally, each of the comparator receives a different triggering threshold. As illustrated, the comparator 2140(1) receives its individual triggering threshold Vf01, the comparator 2140(2) receives Vf02, the comparator 2140(3) receives Vf03, and the comparator 2140(4) receives Vf04. With double edge time measurement (discussed above), the comparator module 2100 and the associated TDC modules can acquire eight pieces of timing information out of eight sample points on the single pulse signal 2200, such as times t1-t8 illustrated in FIG. 22.

As compared to the single triggering threshold comparator module discussed above, a comparator module with multi-comparator configuration is able to acquire more information about the pulse signal, thereby achieving more accurate timing in the LIDAR system. Specifically, the advantages of multiple point timing measurement can include: (a) acquiring more accurate timing information on a pulse signal; and (b) acquiring more accurate energy information on a pulse signal.

With more measuring points, the techniques that can be employed by the MCU to acquire more accurate pulse timing information include, for example, (1) averaging all the acquired timing information; (2) reconstructing the pulse signal based on an established pulse signal model and the data from the multi-point measurement, and estimating the actual timing of the leading edge (or another suitable point) of the reconstructed pulse signal; and/or (3) utilizing data from the multi-point measurement (e.g., t1-t8) and data previously gathered from a known environment (or a controlled environment) to perform regression analysis and derive pulse timing information.

Similarly, With more measuring points, the techniques that can be employed by the MCU to acquire more accurate pulse energy information include, for example, (1) estimating energy based on summing or averaging all the acquired pulse width information (e.g., t1 to t8, t2 to t7, t3 to t3, and t4 to t5); (2) reconstructing the pulse signal based on an established pulse signal model and the data from the multi-point measurement, and performing integration to calculate the area of the reconstructed pulse signal to estimate energy; and/or (3) utilizing data from the multi-point measurement (e.g., t1-t8) and data previously gathered from a known environment (or a controlled environment) to perform regression analysis and derive pulse energy information.

Note that, in some variations, a select number of comparators may be configured to have the same triggering threshold value, for example, for purposes of increasing the accuracy of timing measurement. In some embodiments, multiple measurements can be performed on a spot (e.g., where time t1 is) to create multiple values for the same spot. Then, depending on the embodiment, the MCU can average these multiple values for the same spot. In some implementations, the MCU can select one value that, when compared to the measurements on other spots (e.g., where time t2 to time t8 are), better represents the timing for the spot in question. In yet another variation, the MCU can first select one or more values and then average them. In addition or as an alternative to averaging and/or value selection, the MCU may implement other known statistical methods for increasing measurement accuracy or for other suitable purposes.

11. Conclusion

From the foregoing, it will be appreciated that specific embodiments of the technology have been described herein for purposes of illustration, but that various modifications can be made without deviating from the technology. In representative embodiments, the LIDAR devices can have configurations other than those specifically shown and described herein, including other semiconductor constructions. The various LIDAR modules and circuits described herein may have other configurations in other embodiments, which also produce the desired characteristics (e.g., anti-saturation) described herein.

The various LIDAR modules and circuits described herein may be deployed in one of an aerial vehicle, an aerial platform, an autonomous vehicle, a boat, or a robot.

Certain aspects of the technology described in the context of particular embodiments may be combined or eliminated in other embodiments. Further, while advantages associated with certain embodiments of the technology have been described in the context of those embodiments, other embodiments may also exhibit such advantages, and not all embodiments need necessarily exhibit such advantages to fall with within the scope of the present technology. Accordingly, the present disclosure and associated technology can encompass other embodiments not expressly shown or described herein. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further, any specific numbers noted herein are only examples: alternative implementations may employ differing values or ranges.

To the extent any materials incorporated herein conflict with the present disclosure, the present disclosure controls.

At least a portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

We claim:

1. An unmanned vehicle system, comprising:
   a vehicle chassis;
   a light detection and ranging apparatus;
   a controller configured to maneuver the vehicle in response to readings from the light detection and ranging apparatus; and
   a plurality of mechanisms carried by the vehicle chassis and positioned to maneuver the vehicle in response to inputs from the controller,
   wherein the light detection and ranging apparatus comprises:
      a light sensing module to detect a pulsed light signal and generate a corresponding electrical signal; and
      an amplifier module, coupled to the light sensing module, to process the corresponding electrical signal, wherein the amplifier module includes (1) an operational amplifier having an input and an output, wherein the input and the output form a feedback loop, and (2) anti-saturation circuitry coupled to the operational amplifier, wherein the anti-saturation circuitry includes an operational amplifier anti-saturation circuit positioned in the feedback loop of the operational amplifier to receive an output signal from the output of the operational amplifier and to provide a feedback signal to the input of the operational amplifier so as to selectively reduce a gain of the operational amplifier based on a magnitude of the corresponding electrical signal, or to limit the magnitude of the corresponding electronic signal that the operational amplifier receives to a predetermined range, or both.

2. The system of claim 1, wherein, as the magnitude of the corresponding electronic signal increases, the gain of the operational amplifier is to be proportionally reduced by the operational amplifier anti-saturation circuit.

3. The system of claim 1, wherein the operational amplifier anti-saturation circuit includes a diode that is connected in parallel with a first resistor, a first terminal of the diode connected to the output of the operational amplifier, a second terminal of the diode connected to a first terminal of a second resistor, and a second terminal of the second resistor connected to the input of the operational amplifier.

4. The system of claim 1, wherein the anti-saturation circuitry includes a pre-amplifier anti-saturation circuit positioned between a signal input of the amplifier module and the input of the operational amplifier, to limit the magnitude of the corresponding electronic signal that the operational amplifier receives.

5. The system of claim 4, wherein the pre-amplifier anti-saturation circuit includes a diode that is connected between the signal input of the amplifier module and a reference voltage, and wherein the pre-amplifier anti-saturation circuit further includes an input resistor that is connected between the signal input of the amplifier module and the input of the operational amplifier.

6. The system of claim 1, wherein the anti-saturation circuitry further includes a post-amplifier anti-saturation circuit positioned between a signal output of the amplifier module and the output of the operational amplifier, to limit a magnitude of an amplified electronic signal that the operational amplifier outputs.

7. The system of claim 6, wherein the post-amplifier anti-saturation circuit includes a diode that is connected between the signal output of the amplifier module and a reference voltage, and
   wherein the post-amplifier anti-saturation circuit further includes an output resistor that is connected between the signal output of the amplifier module and the output of the operational amplifier.

8. The system of claim 1, further comprising:
   a pulse information acquisition subsystem to extract pulse information based on the corresponding electronic signal; and
   a controller having an input to receive the pulse information and configured to compensate for a timing error based on the pulse information.

9. The system of claim 8, wherein the pulse information includes pulse energy information, and wherein an amount of the timing error that the controller is configured to compensate is inversely proportional to an amount of energy indicated in the pulse energy information.

10. The system of claim 8, wherein the pulse information acquisition subsystem comprises an integrator circuit for calculating pulse energy information of a given pulse by performing integration to calculate an area of the given pulse.

11. The system of claim 8, wherein the pulse information acquisition subsystem comprises (1) a peak holding circuit for retaining peak information of a given pulse, and/or (2) a pulse expansion circuit for expanding a waveform of a given pulse.

12. The system of claim 8, wherein the controller is further configured to dynamically control one or more operating parameters of the light detection and ranging system based on an amount and/or a type of noise observed by the controller.

13. The system of claim 12, wherein the one or more operating parameters include a triggering threshold of a comparator module, and wherein the controller is configured to increase the triggering threshold of the comparator module when the amount of noise exceeds the triggering threshold of the comparator module.

14. The system of claim 13, wherein the comparator module includes a first comparator and
   a second comparator coupled to a same input as the first comparator in the comparator module, wherein the second comparator is configured with a different triggering threshold voltage than the first comparator.

15. The system of claim 12, wherein the one or more operating parameters include a gain of the light sensing module, and wherein the controller is configured to reduce the gain of the light sensing module when the amount of noise exceeds a triggering threshold of a comparator module.

16. The system of claim 1, wherein the controller is configured to determine whether ambient light is a dominant source of noise observed by the controller.

17. The system of claim 16, wherein the controller is configured to, when the ambient light is determined to be the dominant source of the noise observed by the controller, prioritize reducing the gain of the light sensing module for reducing possible interference from the noise.

18. The system of claim 16, wherein the controller is configured to, when the ambient light is determined not to be the dominant source of the noise observed by the controller, prioritize increasing a triggering threshold of the comparator module for reducing possible interference from the noise.

19. The system of claim 1, wherein said extraction of pulse information includes performing double edge timing measurement of a pulse.

20. The system of claim 19, wherein the controller is configured to compensate for a timing error based on said double edge timing measurement.

21. The system of claim 19, wherein the controller is configured to estimate pulse energy information based on said double edge timing measurement.

22. The system of claim 19, wherein the controller is to estimate a surface profile of an object detected by the system based on said double edge timing measurement.

23. The system of claim 1, further comprising:
a subsequent amplifier module coupled to the amplifier module to form a multi-stage amplifier.

24. The system of claim 14, wherein each comparator is connected to an individual time-to-digital converter module.

* * * * *